(12) United States Patent
Miyoshi

(10) Patent No.: US 8,558,543 B2
(45) Date of Patent: *Oct. 15, 2013

(54) MAGNETIC RESONANCE IMAGING APPARATUS AND METHOD FOR CONTROLLING THE VELOCITY OF VENUOUS AND ARTERIAL BLOOD

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 804 days.

This patent is subject to a terminal disclaimer.

(21) Appl. No.: 12/544,942

(22) Filed: Aug. 20, 2009

(65) Prior Publication Data

US 2010/0045290 A1    Feb. 25, 2010

(30) Foreign Application Priority Data

Aug. 25, 2008 (JP) .................................. 2008-214795

(51) Int. Cl.
A61B 5/055        (2006.01)

(52) U.S. Cl.
USPC ............ 324/306; 324/307; 324/309; 600/420

(58) Field of Classification Search
USPC .......................... 324/300–322; 600/407–435; 382/128–131
See application file for complete search history.

(56) References Cited

U.S. PATENT DOCUMENTS

| | | | | |
|---|---|---|---|---|
| 4,800,889 A | * | 1/1989 | Dumoulin et al. | 600/413 |
| 5,054,489 A | * | 10/1991 | Axel et al. | 600/419 |
| 5,133,357 A | * | 7/1992 | Dumoulin et al. | 600/413 |
| 5,233,298 A | * | 8/1993 | Dumoulin | 324/306 |
| 5,245,282 A | * | 9/1993 | Mugler et al. | 324/309 |
| 5,280,244 A | | 1/1994 | Hinks | |
| 5,327,088 A | * | 7/1994 | Pipe | 324/309 |
| 5,402,786 A | * | 4/1995 | Drummond | 600/410 |
| 5,590,654 A | * | 1/1997 | Prince | 600/420 |
| 5,792,056 A | * | 8/1998 | Prince | 600/420 |
| 5,842,989 A | * | 12/1998 | Zur | 600/410 |

(Continued)

FOREIGN PATENT DOCUMENTS

| | | |
|---|---|---|
| JP | 2007190362 | 8/2007 |
| JP | 2008-119514 | 5/2008 |

OTHER PUBLICATIONS

Non-Final Office Action for U.S. Appl. No. 12/392,225 dated Oct. 17, 2012, 14 pages.

(Continued)

Primary Examiner — Melissa Koval
Assistant Examiner — Tiffany Fetzner
(74) Attorney, Agent, or Firm — Armstrong Teasdale LLP

(57) ABSTRACT

A magnetic resonance imaging apparatus includes a coil control device that controls a transmission coil and a gradient coil such that (A) a longitudinal magnetization adjustment pulse sequence for setting a longitudinal magnetization component positive in value of a first body fluid smaller than a longitudinal magnetization component positive in value of a second body fluid is executed on the first and second body fluids, (B) a longitudinal magnetization reverse pulse for reversing the longitudinal magnetization components of the first and second body fluids is transmitted, and (C) a data acquisition pulse sequence for acquiring data of the first body fluid when an absolute value of the longitudinal magnetization component of the first body fluid flowing through an imaging area is larger than an absolute value of the longitudinal magnetization component of the second body fluid, is executed.

18 Claims, 15 Drawing Sheets

(56) References Cited

U.S. PATENT DOCUMENTS

| | | | |
|---|---|---|---|
| 6,141,578 A | 10/2000 | Hardy | |
| 6,240,311 B1 * | 5/2001 | Prince | 600/420 |
| 6,320,377 B1 | 11/2001 | Miyazaki et al. | |
| 6,408,201 B1 * | 6/2002 | Foo et al. | 600/410 |
| 6,438,404 B1 | 8/2002 | Van Den Brink et al. | |
| 6,463,318 B2 * | 10/2002 | Prince | 600/420 |
| 6,741,881 B2 * | 5/2004 | Prince | 600/420 |
| 6,754,521 B2 * | 6/2004 | Prince | 600/420 |
| 6,782,286 B2 | 8/2004 | Miyazaki | |
| 6,801,800 B2 | 10/2004 | Miyazaki et al. | |
| 6,842,000 B2 * | 1/2005 | Norris et al. | 324/309 |
| 7,141,972 B2 | 11/2006 | Avram et al. | |
| 7,328,054 B2 * | 2/2008 | Jesmanowicz | 600/410 |
| 7,514,925 B2 | 4/2009 | Miyoshi | |
| 7,541,809 B2 | 6/2009 | Miyoshi | |
| 7,689,267 B2 * | 3/2010 | Prince | 600/420 |
| 8,078,259 B2 * | 12/2011 | Prince | 600/420 |
| 2001/0034483 A1 * | 10/2001 | Prince | 600/420 |
| 2003/0163036 A1 * | 8/2003 | Prince | 600/420 |
| 2004/0066194 A1 * | 4/2004 | Slade et al. | 324/318 |
| 2004/0204643 A1 * | 10/2004 | Jesmanowicz | 600/410 |
| 2004/0210130 A1 * | 10/2004 | Prince | 600/420 |
| 2007/0167733 A1 * | 7/2007 | Miyoshi | 600/410 |
| 2010/0045290 A1 * | 2/2010 | Miyoshi | 324/309 |
| 2011/0044524 A1 * | 2/2011 | Wang et al. | 382/131 |
| 2011/0054301 A1 * | 3/2011 | Prince | 600/420 |
| 2011/0144474 A1 * | 6/2011 | Ouwerkerk | 600/410 |

OTHER PUBLICATIONS

Sung et al., "Double Inversion Recovery First-Pass Myocardial Perfusion Imaging at 3 Tesla", Proc. Intl. Soc. Mag. Reason. Med. 15, May 2007, #2584.

Miyoshi et al., "Flow-Saturation-preparation pulse for lower extremity Non-Contrast-Agent MR Angiography", Proc. Intl Soc. Mag. Reason. Med 15, May 2007, #180).

* cited by examiner

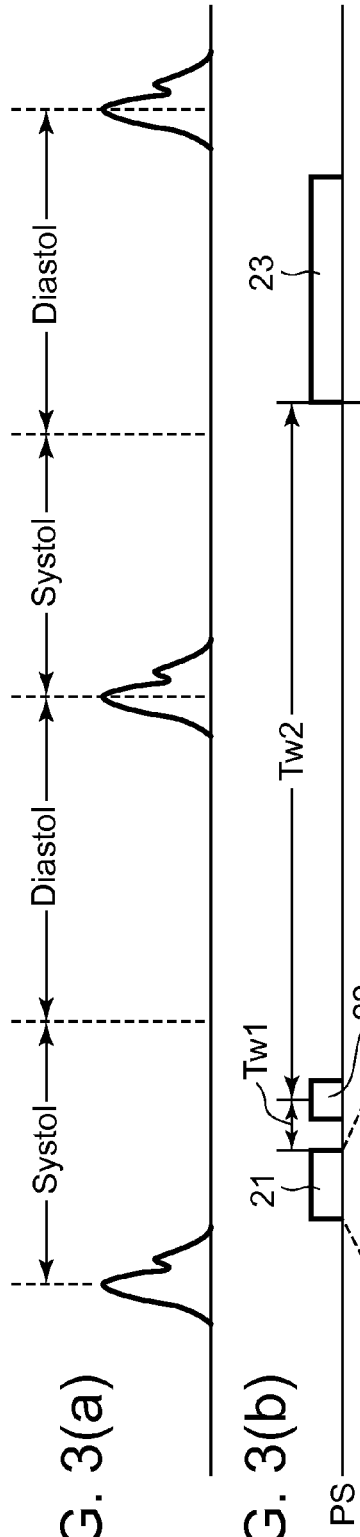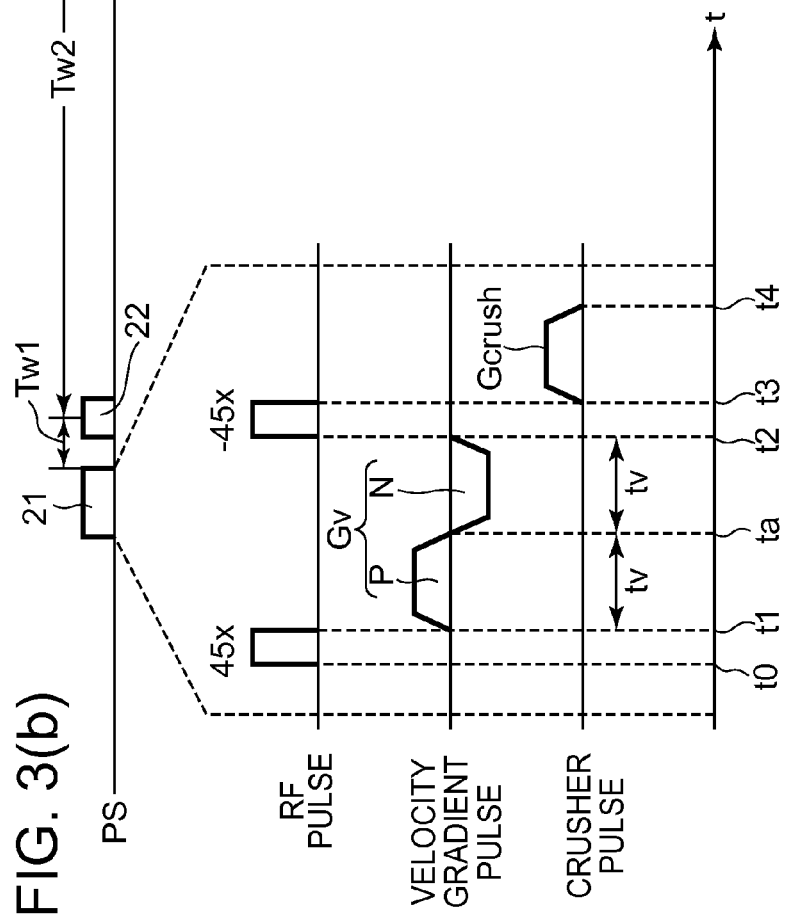

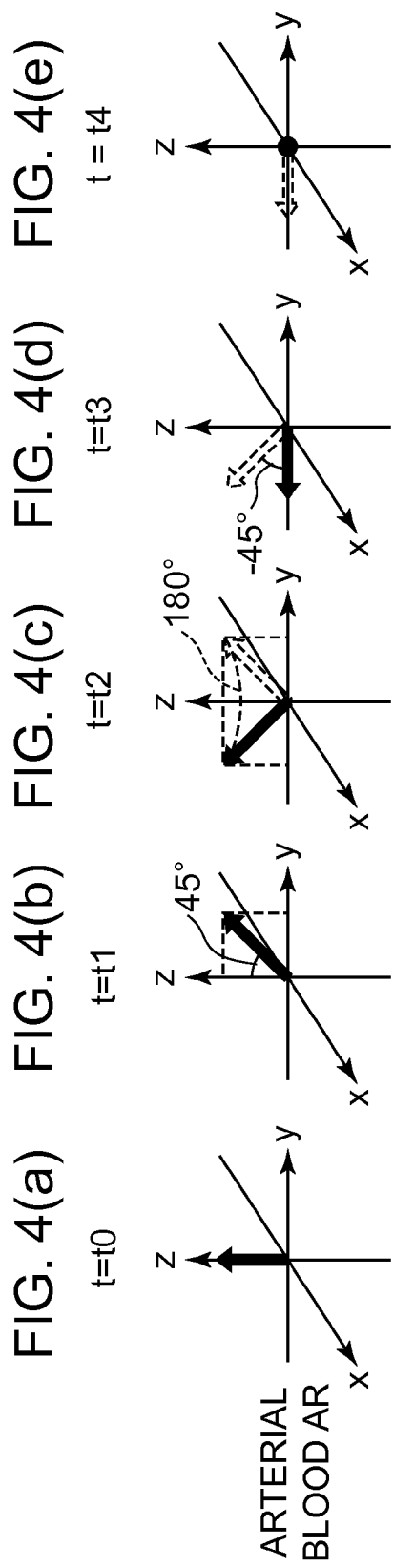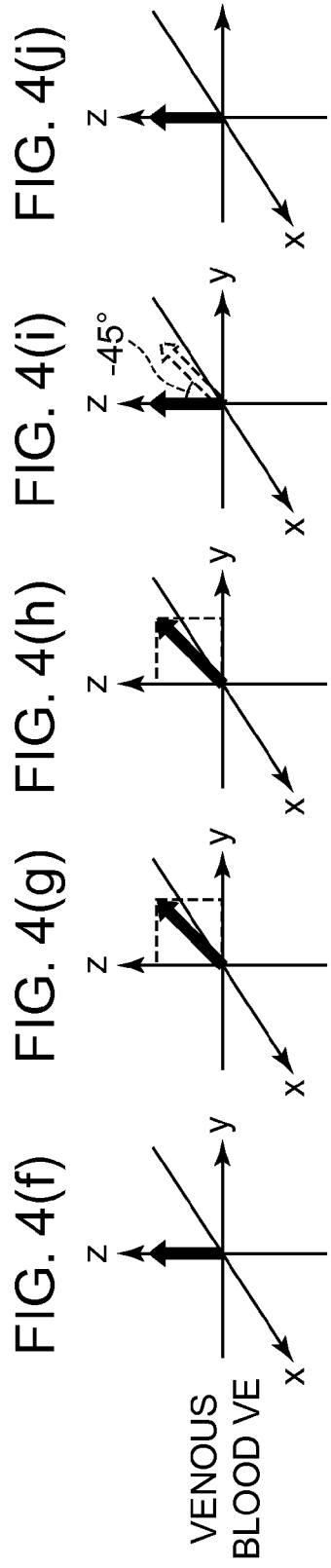

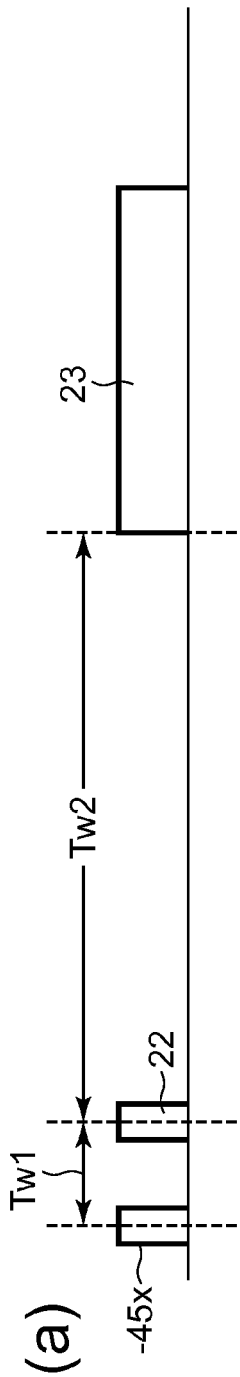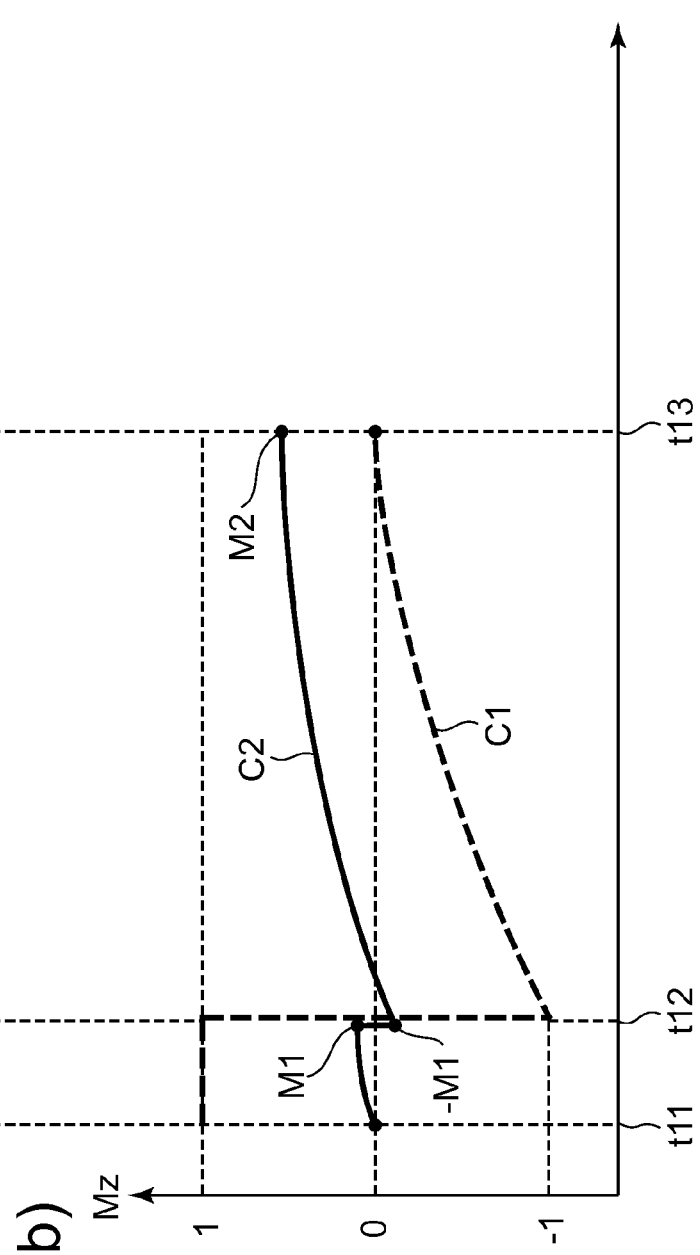
FIG. 5(a)
FIG. 5(b)

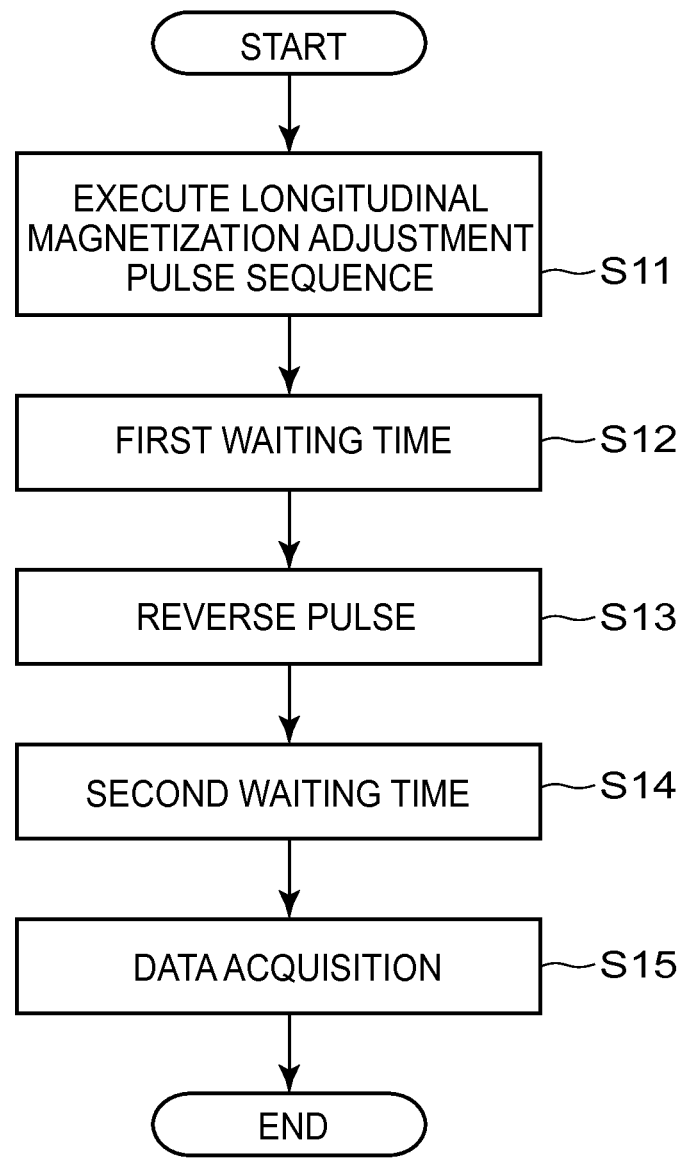

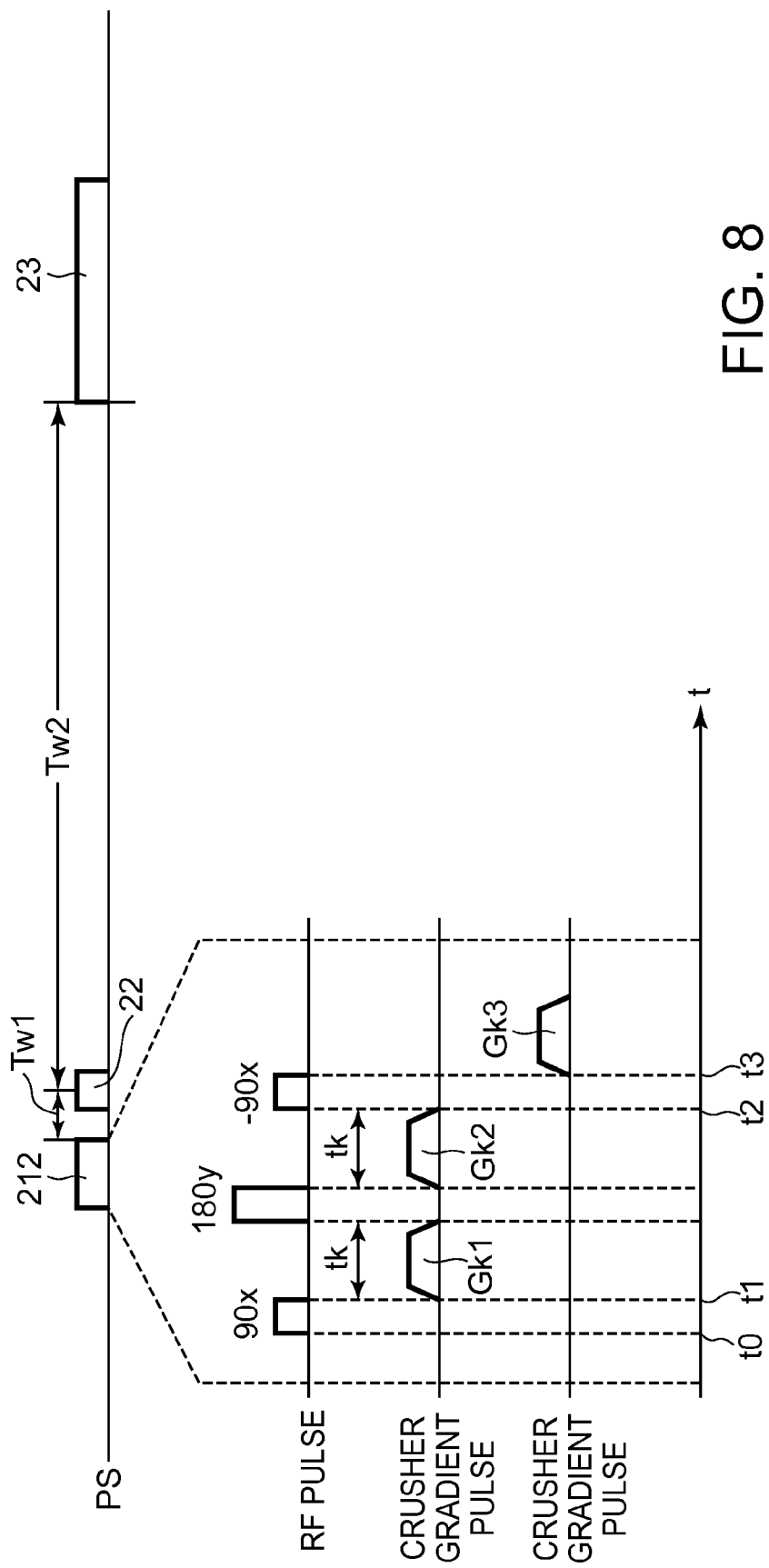

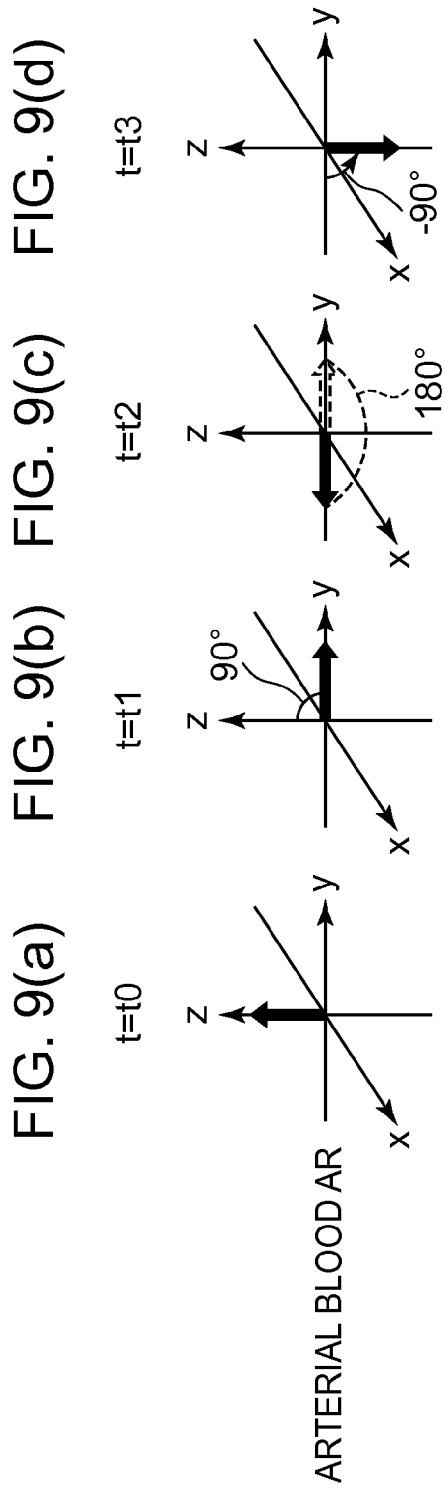
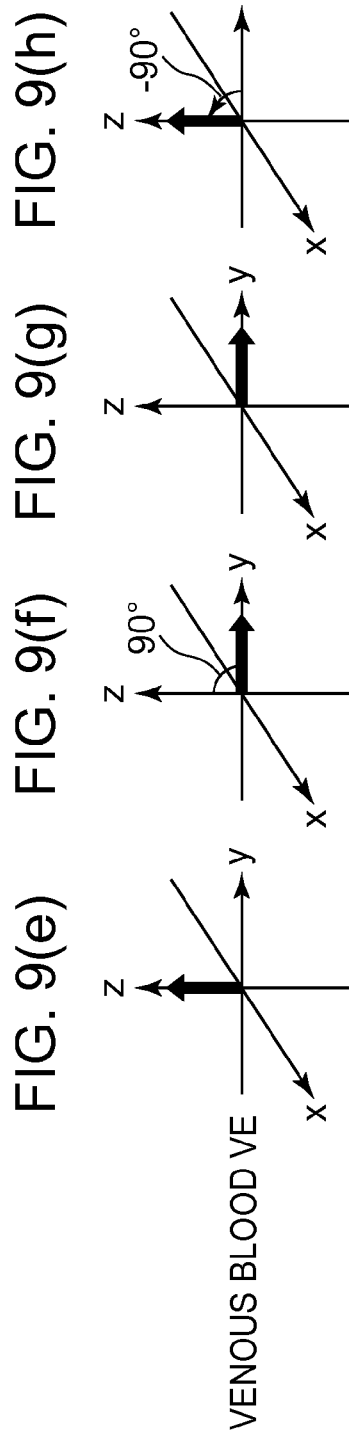

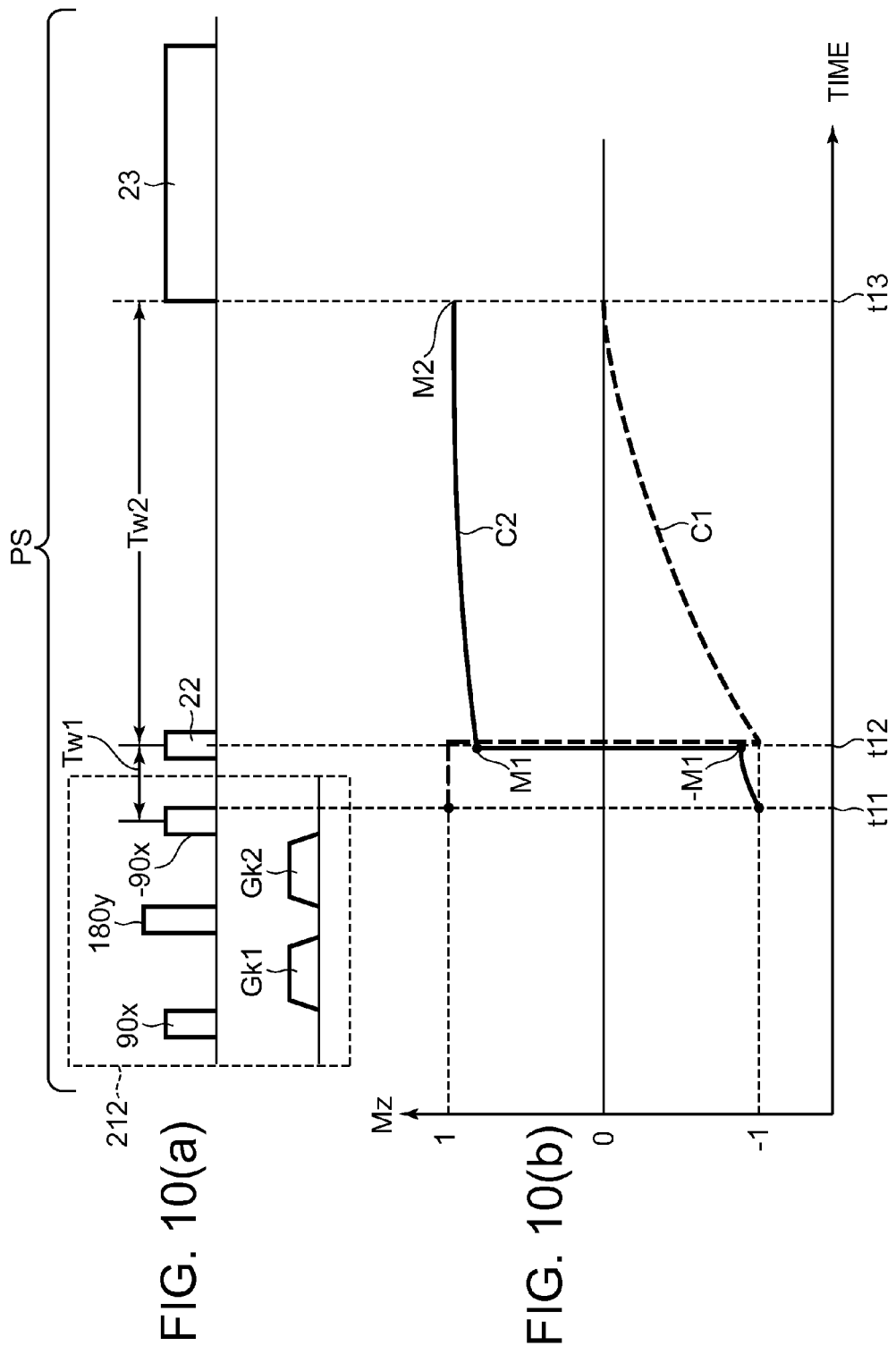

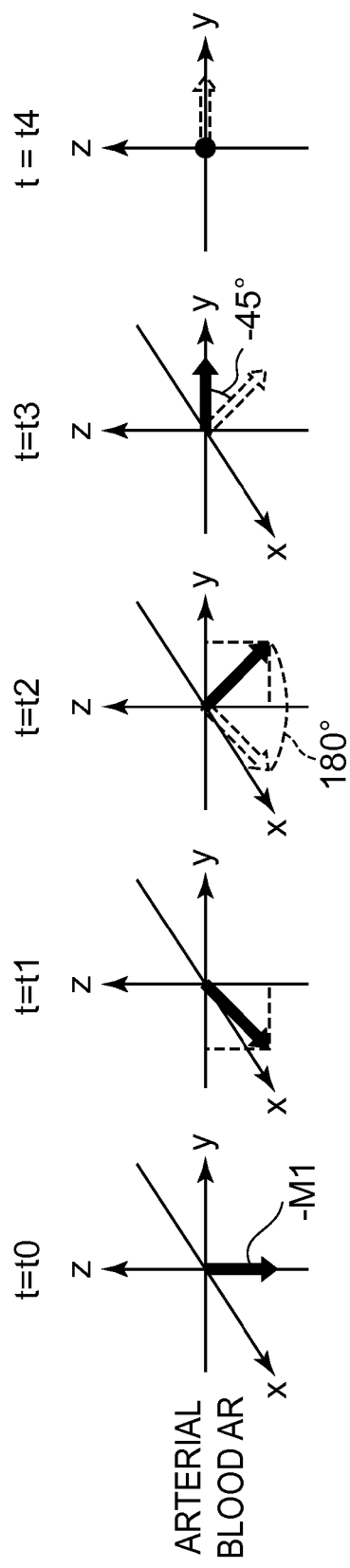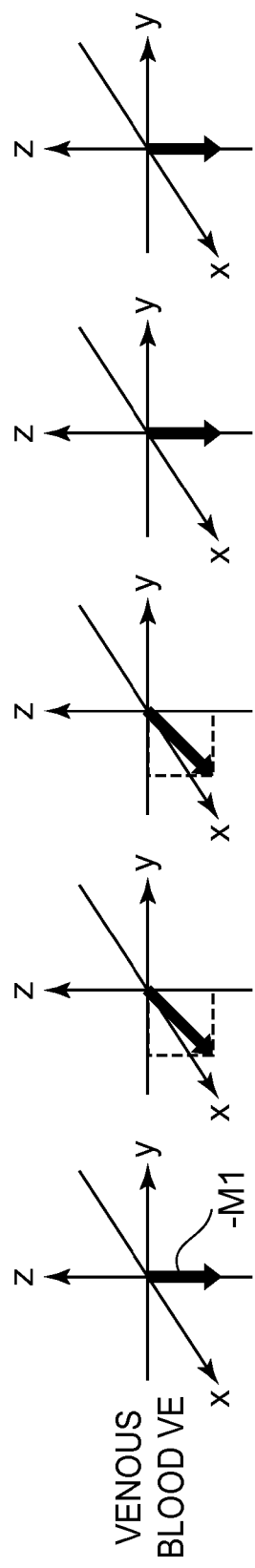

MAGNETIC RESONANCE IMAGING APPARATUS AND METHOD FOR CONTROLLING THE VELOCITY OF VENUOUS AND ARTERIAL BLOOD

CROSS REFERENCE TO RELATED APPLICATIONS

This application claims the benefit of Japanese Patent Application No. 2008-214795 filed Aug. 25, 2008, which is hereby incorporated by reference in its entirety.

BACKGROUND OF THE INVENTION

The embodiments described herein relate to a magnetic resonance imaging apparatus for imaging a subject and a method for controlling the magnetic resonance imaging apparatus.

There has heretofore been known a method for imaging arterial blood with emphasis on the same than other body fluids (venous blood and the like) (refer to Japanese Unexamined Patent Publication No. 2008-119514).

In at least some known methods, there is a need to perform a scan for obtaining an image at diastole and a scan for obtaining an image at systole period and determine the difference between the images obtained by these scan, for the purpose of obtaining an image in which the arterial blood is emphasized than the venous blood. Thus, the patent literature 1 is accompanied by a problem that an imaging time interval becomes long.

BRIEF DESCRIPTION OF THE INVENTION

A first aspect of the invention provides a magnetic resonance imaging (MRI) apparatus which images a subject such that a first body fluid of the subject is emphasized over a second body fluid flowing at a velocity slower than the first body fluid, including: a transmission coil for transmitting an RF pulse to the subject. The MRI apparatus includes a gradient coil for applying a gradient pulse to the subject; and a coil control device for controlling the transmission coil and the gradient coil, wherein the coil control device controls the transmission coil and the gradient coil such that (A) a longitudinal magnetization adjustment pulse sequence for setting a longitudinal magnetization component positive in value of the first body fluid smaller than a longitudinal magnetization component positive in value of the second body fluid is executed on the first and second body fluids, (B) after the execution of the longitudinal magnetization adjustment pulse sequence, a longitudinal magnetization reverse pulse for reversing the longitudinal magnetization components of the first and second body fluids is transmitted, and (C) after the transmission of the longitudinal magnetization reverse pulse, a data acquisition pulse sequence for acquiring data of the first body fluid when an absolute value of the longitudinal magnetization component of the first body fluid flowing through an imaging area is larger than an absolute value of the longitudinal magnetization component of the second body fluid, is executed.

A second aspect of the invention provides an MRI apparatus which images a subject such that a first body fluid of the subject is emphasized over a second body fluid flowing at a velocity slower than the first body fluid. The MRI apparatus includes a transmission coil for transmitting an RF pulse to the subject; a gradient coil for applying a gradient pulse to the subject; and a coil control device for controlling the transmission coil and the gradient coil, wherein the coil control device controls the transmission coil and the gradient coil such that (A) a longitudinal magnetization reverse pulse for reversing longitudinal magnetization components positive in value, of the first and second body fluids such that the first and second body fluids respectively have longitudinal magnetization components negative in value is transmitted, (B) after the transmission of the longitudinal magnetization reverse pulse, a longitudinal magnetization adjustment pulse sequence for setting the longitudinal magnetization component of the first body fluid larger than the longitudinal magnetization component of the second body fluid is executed, and (C) after the transmission of the longitudinal magnetization reverse pulse, a data acquisition pulse sequence for acquiring data of the first body fluid when an absolute value of the longitudinal magnetization component of the first body fluid flowing through an imaging area is larger than an absolute value of the longitudinal magnetization component of the second body fluid, is executed.

A third aspect provides a method for controlling a magnetic resonance imaging apparatus.

In a first aspect, a longitudinal magnetization component of a first body fluid is set smaller than a longitudinal magnetization component of a second body fluid. Thereafter, the longitudinal magnetization components of the first and second body fluids are inverted. Thus, the longitudinal magnetization component of the first body fluid can be made larger than the longitudinal magnetization component of the second body fluid. After the longitudinal magnetization component of the first body fluid has been set larger than the longitudinal magnetization component of the second body fluid, data are acquired when an absolute value of the longitudinal magnetization component of the first body fluid flowing through an imaging area is larger than an absolute value of the longitudinal magnetization component of the second body fluid. Thus, the first body fluid can be imaged with more emphasis than the second body fluid.

In a second aspect, longitudinal magnetization components of first and second body fluids are reversed and thereafter the longitudinal magnetization component of the first body fluids set larger than the longitudinal magnetization component of the second body fluid. After the longitudinal magnetization component of the first body fluid has been set larger than the longitudinal magnetization component of the second body fluid, data are acquired when an absolute value of the longitudinal magnetization component of the first body fluid flowing through an imaging area is larger than an absolute value of the longitudinal magnetization component of the second body fluid. Thus, the first body fluid can be imaged with more emphasis than the second body fluid.

BRIEF DESCRIPTION OF THE DRAWINGS

FIGS. 3(a) and 3(b) are diagrams for illustrating one example of a pulse sequence for imaging arterial blood AR and at which timing the pulse sequence is executed.

FIGS. 4(a) through 4(j) are diagrams schematically illustrating the behaviors of magnetization vectors of the arterial blood AR and venous blood VE while a longitudinal magnetization adjustment pulse sequence is being executed.

FIGS. 5(a) and 5(b) show longitudinal magnetization recovery curves of the arterial blood AR and venous blood VE where the pulse sequence PS is executed.

FIG. 6 is a diagram illustrating one example of a processing flow of the MRI apparatus 1.

FIG. 8 is a diagram illustrating one example of a pulse sequence that shifts the phases of the arterial blood and the venous blood using crusher gradient pulses.

FIGS. 9(a) through 9(h) are diagrams illustrating the behaviors of the arterial blood AR and the venous blood VE while a longitudinal magnetization adjustment pulse sequence is being executed.

FIGS. 10(a) and 10(b) are diagrams illustrating longitudinal magnetization recovery curves of the arterial blood AR and the venous blood VE where the pulse sequence PS shown in FIG. 8 is executed.

FIGS. 15(a) through 15(j) are diagrams illustrating the behaviors of magnetization vectors of the arterial blood AR and venous blood VE of the subject 11 during a period from the start of execution of a longitudinal magnetization adjustment pulse sequence 21 to its completion.

DETAILED DESCRIPTION OF THE INVENTION

Embodiments of the invention will hereinafter be explained in detail with reference to the accompanying drawings. Incidentally, the invention is not limited to the embodiments described herein.

(1) First Embodiment

Figure 1:
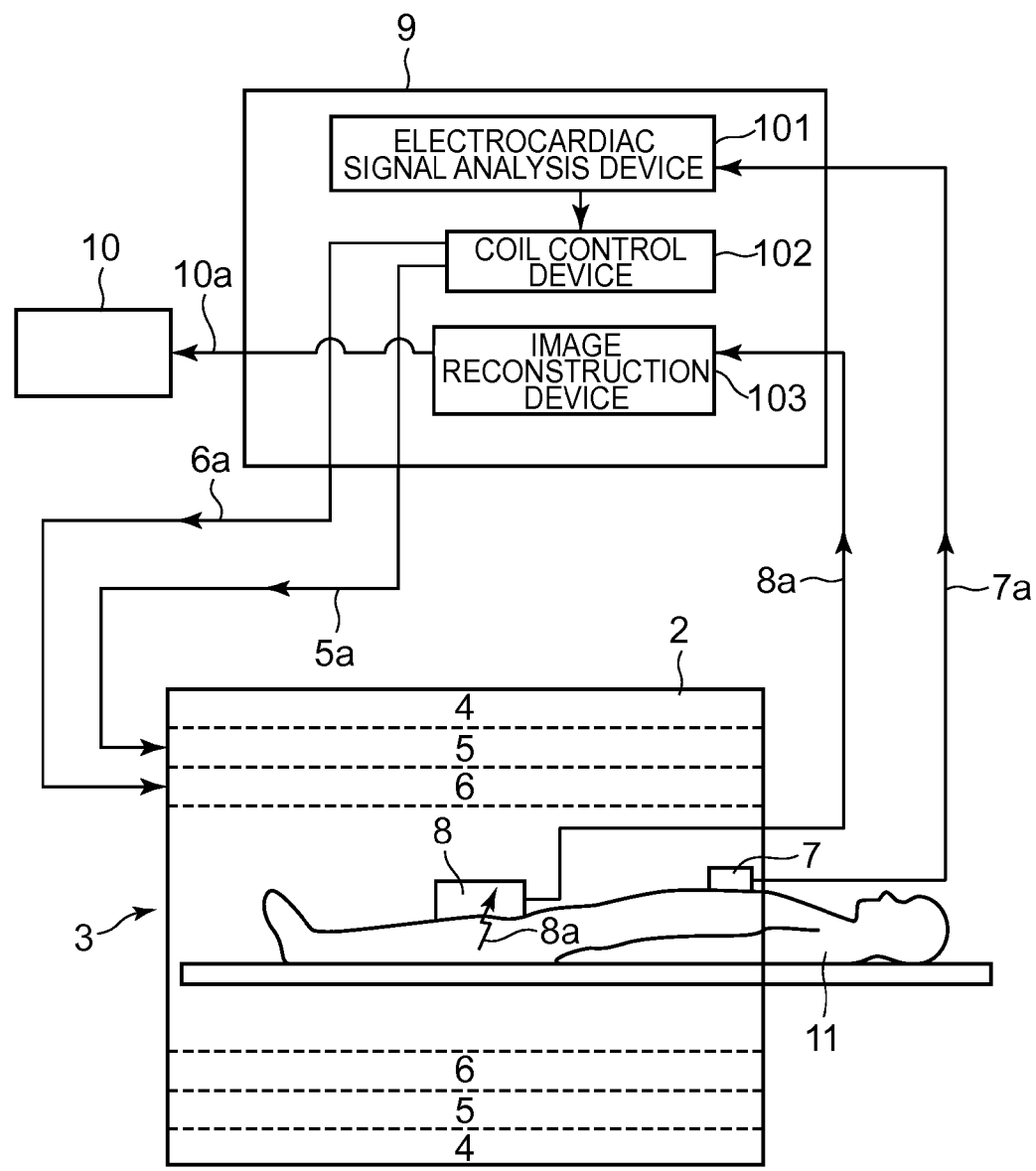
FIG. 1 is a block diagram of an MRI apparatus 1 according to a first embodiment of the invention.

FIG. 1 is a block diagram of a magnetic resonance imaging apparatus (hereinafter called "MRI (Magnetic Resonance Imaging) apparatus") 1 according to a first embodiment of the invention. The MRI apparatus 1 is one example of the best mode for carrying out the invention.

The MRI apparatus 1 has a coil assembly 2. The coil assembly 2 has a bore 3 for inserting a subject 11 therein. The coil assembly 2 includes a superconductive coil 4, a gradient coil 5 and a transmission coil 6. The superconductive coil 4 applies a static magnetic field B0 to within the bore 3. The gradient coil 5 applies a gradient pulse to within the bore 3. The transmission coil 6 transmits an RF pulse to within the bore 3.

The MRI apparatus 1 has a heartbeat sensor 7 and a reception coil 8. The heartbeat sensor 7 detects the heartbeat of the subject 11 and generates an electrocardiac signal 7a. The reception coil 8 receives an MR signal 8a from the subject 11.

The MRI apparatus 1 has a controller 9. The controller 9 has an electrocardiac signal analysis device 101, a coil control device 102 and an image reconstruction device 103.

The electrocardiac signal analysis device 101 analyzes the electrocardiac signal 7a.

The coil control device 102 generates a gradient coil control signal 5a for controlling the gradient coil 5 and a transmission coil control signal 6a for controlling the transmission coil 6 in such a manner that a pulse sequence PS (refer to FIG. 3 to be described later), based on the result of analysis by the electrocardiac signal analysis device 101.

The image reconstruction device 103 reconstructs an image, based on the MR signal 8a and generates an image signal 10a.

Further, the MRI apparatus 1 has a display unit 10. The display unit 10 displays an image corresponding to the image signal 10a.

Figure 2:
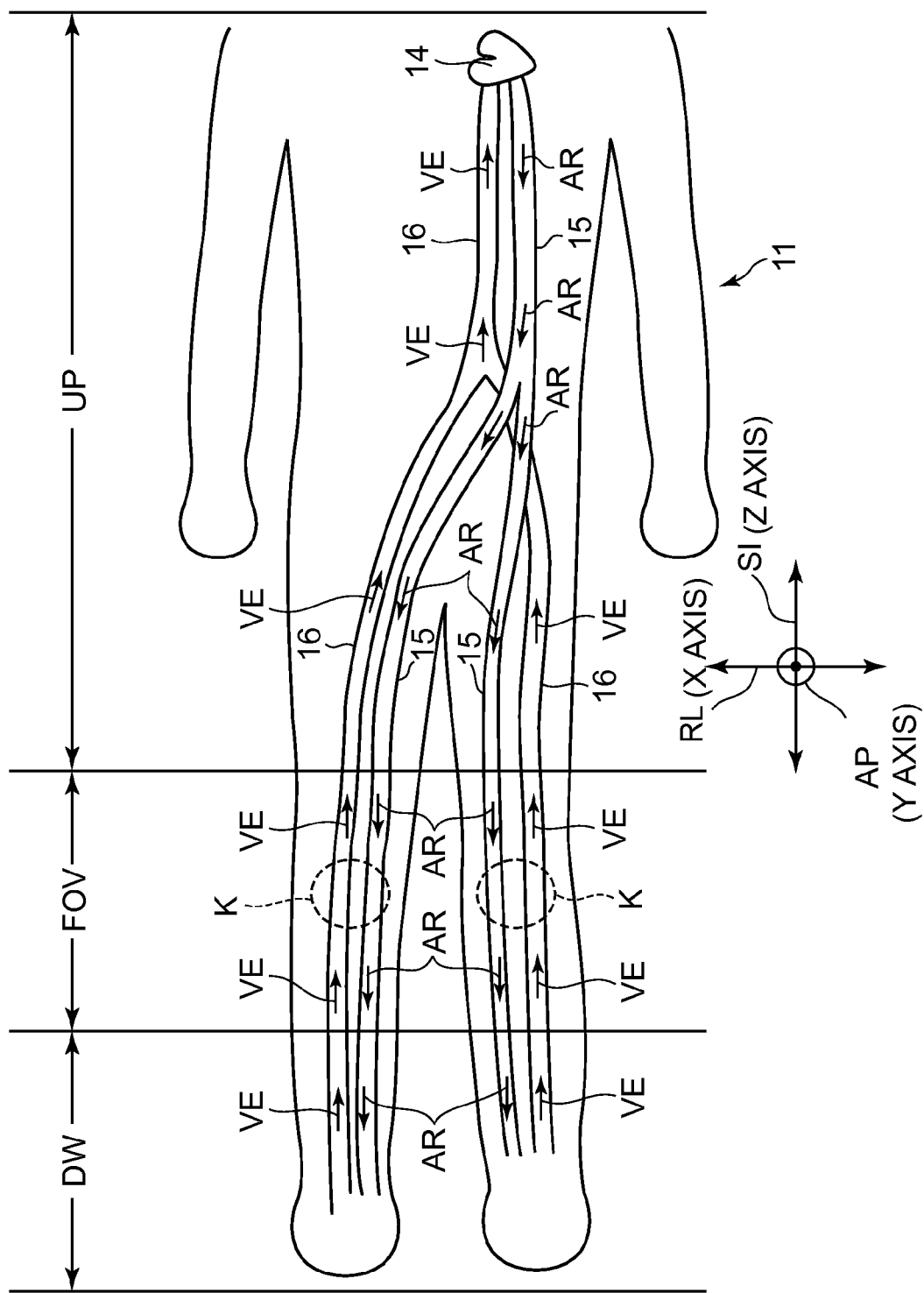
FIG. 2 is a diagram schematically illustrating a field of view FOV of a subject 11.

FIG. 2 is a diagram schematically illustrating an imaging area or a field of view FOV of the subject 11.

A heart 14, arteries 15 and veins 16 are shown in FIG. 2. Arterial blood AR flows from an upstream area UP to a downstream area DW via the field of view FOV. Contrary to the arterial blood AR, venous blood VE flows from the downstream area DW to the upstream area UP via the field of view FOV. In the first embodiment, the field of view FOV contains knee joints K of the subject 11 and its peripheral regions. A description will hereinafter be made of the case where an MR image of the arterial blood AR flowing through the field of view FOV is acquired.

Incidentally, the venous blood VE untargeted for imaging is also contained in the field of view FOV in addition to the arterial blood AR targeted for imaging. Since the present embodiment considers that the arterial blood AR is visualized, it becomes difficult to visually identify the state of the bloodstream of the arterial blood AR when the venous blood VE is also visualized together with the arterial blood AR. Thus, there is a need to avoid the visualization of the venous blood VE untargeted for imaging as much as possible. Therefore, when the arterial blood AR is imaged, the following pulse sequence is executed in the first embodiment.

FIGS. 3(a) and 3(b) are diagrams for illustrating one example of a pulse sequence for imaging the arterial blood AR and at which timing the pulse sequence is executed.

FIG. 3(a) is a graph illustrating an electrocardiac waveform ECG of the subject 11, and FIG. 3(b) is a pulse sequence PS for imaging the arterial blood AR.

The pulse sequence PS shown in FIG. 3(b) contains a longitudinal magnetization adjustment pulse sequence 21, a reverse pulse 22 and a data acquisition pulse sequence 23.

The longitudinal magnetization adjustment pulse sequence 21 is of a pulse sequence for making a longitudinal magnetization component Mz of the arterial blood AR smaller than a longitudinal magnetization component of the venous blood VE. The longitudinal magnetization adjustment pulse sequence 21 has two RF pulses (45x and −45x), a velocity encode gradient pulse Gv and a crusher gradient pulse Gcrush. The velocity encode gradient pulse Gv is applied in a longitudinal or up-and-down direction SI (refer to FIG. 2). The RF pulses 45x and −45x, velocity encode gradient pulse Gv and crusher gradient pulse Gcrush are of such pulses as described below.

RF pulse 45x: magnetization vectors of arterial blood AR and venous blood VE are rotated 45° in a positive direction about an x axis.

RF pulse −45x: magnetization vectors of arterial blood AR and venous blood VE are rotated 45° in a negative direction about the x axis.

Velocity encode gradient pulse Gv: velocity encode gradient pulse Gv has a positive gradient pulse P and a negative gradient pulse N. The positive gradient pulse P and the negative gradient pulse N are opposite in polarity to each other, but are identical in the magnitude of a gradient field and identical in application time too. The velocity encode gradient pulse Gv has the role of shifting the phase of the magnetization vector of the arterial blood AR and the phase of the magnetization vector of the venous blood VE from each other. This role will be described in detail later.

Crusher gradient pulse Gcrush: it has the role of causing a horizontal or transverse magnetization component of the arterial blood AR to disappear (refer to FIG. 4(e) to be described later).

A description will next be made of the reason why the longitudinal magnetization component of the arterial blood AR can be made smaller than the longitudinal magnetization component of the venous blood VE by using the longitudinal magnetization adjustment pulse sequence 21.

FIGS. 4(a) through 4(j) are diagrams schematically illustrating the behaviors of magnetization vectors of the arterial blood AR and the venous blood VE while the longitudinal magnetization adjustment pulse sequence 21 is being executed.

FIGS. 4(a), 4(b), 4(c), 4(d), and 4(e) respectively indicate the orientations of magnetization vectors of the arterial blood AR at times t=t0, t1, t2, t3 and t4 taken while the longitudinal magnetization adjustment pulse sequence 21 shown in FIG. 3 is being executed. Further, FIGS. 4(f), 4(g), 4(h), 4(i), and 4(j) respectively indicate the orientations of magnetization vectors of the venous blood VE at the times t=t0, t1, t2, t3 and t4 taken while the longitudinal magnetization adjustment pulse sequence 21 shown in FIG. 3(b) is being executed.

The meanings of the respective times t=t0, t1, t2, t3 and t4 are as follows:

t0: applying start time of RF pulse 45x, t1: applying end time of RF pulse 45x (applying start time of velocity encode gradient pulse Gv), t2: applying end time of velocity encode gradient pulse Gv (applying start time of RF pulse −45x), t3: applying end time of RF pulse −45x (applying start time of crusher gradient pulse Gcrush) and t4: applying end time of crusher gradient pulse Gcrush.

A description will next be made of the orientations of the magnetization vectors of the arterial blood AR and the venous blood VE at the respective times t=t0, t1, t2, t3 and t4.

time t=t0 (1)

Since the time t=t0 indicates the time at which the application of the RF pulse 45x is started, the magnetization vectors of the arterial blood AR and the venous blood VE are still oriented in a z-axis direction as indicated in FIGS. 4(a) and 4(f) at the time t=t0.

time t=t0 to t1 (2)

The RF pulse 45x is applied.

time t=t1 (3)

Since the application of the RF pulse 45x has been completed, the magnetization vectors of the arterial blood AR and the venous blood VE are tilted from the direction of 0° (z axis) to the direction of 45° within a yz plane as indicated in FIGS. 4(b) and 4(g).

time t=t1 to t2 (4)

The velocity encode gradient pulse Gv is applied during the time t=t1 to t2. The positive gradient pulse P and the negative gradient pulse N of the velocity encode gradient pulse Gv are opposite in polarity to each other, but identical in the magnitude of a gradient field and identical in application time too.

Since the venous blood VE is sufficiently slower in flow rate than the arterial blood AR, the moving distance of the venous blood VE between the times t1 and t2 can be ignored. Thus, even if the velocity encode gradient pulse Gv is applied, the phase of each magnetization vector of the venous blood VE does not change. Eventually, the phase (refer to of FIG. 4(h)) of the magnetization vector of the venous blood VE at the applying end time t2 of the velocity encode gradient pulse Gv is identical to the phase (refer to of FIG. 4(g)) of the magnetization vector of the venous blood VE at the applying start time t1 of the velocity encode gradient pulse Gv.

However, the arterial blood AR is moved at a blood flow velocity sufficiently faster than that of the venous blood VE. Thus, the phase of the magnetization vector of the arterial blood AR changes with the application of the velocity encode gradient pulse Gv. Since the velocity encode gradient pulse Gv is applied in the up-and-down direction SI (refer to FIG. 2) in the first embodiment, the phase of the magnetization vector of the arterial blood AR flowing in the up-and-down direction SI changes with the application of the velocity encode gradient pulse Gv. In the first embodiment, the velocity encode gradient pulse Gv is defined or prescribed in such a manner that the phase of the magnetization vector of the arterial blood AR flowing in the up-and-down direction SI changes by 180° about the z axis as shown in FIG. 4(c).

As described above, the phase of the magnetization vector of the arterial blood VE does not change even if the velocity encode gradient pulse Gv is applied (refer to FIGS. 4(g) and 4(h)). When, however, the velocity encode gradient pulse Gv is applied, the phase of the magnetization vector of the arterial blood AR flowing in the up-and-down direction SI changes 180° (refer to FIGS. 4(b) and 4(c)). Thus, the phase of the magnetization vector of the arterial blood AR flowing in the up-and-down direction SI can be shifted 180° with respect to the phase of the magnetization vector of the venous blood VE by application of the velocity encode gradient pulse Gv.

time t2 to t3 (5)

The RF pulse −45x is applied.

time t3 (6)

Since the application of the RF pulse −45x is completed, the magnetization vectors of the arterial blood AR and the venous blood VE are rotated −45° about the x axis. Thus, with the transmission of the RF pulse −45x, the magnetization vectors of the arterial blood AR and the venous blood VE can be rotated −45° within the yz plane as indicated in FIGS. 4(d) and 4(i).

time t3 to t4 (7)

It is understood that referring to FIGS. 4(d) and 4(i), the magnetization vector of the venous blood VE has the longitudinal magnetization component Mz, whereas the longitudinal magnetization component Mz of the magnetization vector of the arterial blood AR is zero. Since, however, the magnetization vector of the arterial blood AR has a transverse magnetization component My, the crusher gradient pulse Gcrush (refer to FIG. 3(b)) is applied to bring the transverse magnetization component My to zero.

time t4 (8)

With the application of the crusher gradient pulse Gcrush, the transverse magnetization component My of the magnetization vector of the arterial blood AR can be set to zero as shown in FIG. 4(e).

By executing the longitudinal magnetization adjustment pulse sequence 21 shown in FIG. 3(b) as described above, the longitudinal magnetization component Mz of the arterial blood AR flowing in the up-and-down direction SI becomes Mz=0, and the longitudinal magnetization component Mz of the venous blood VE becomes Mz=1 (refer to FIGS. 4(e) and 4(j)). Accordingly, the longitudinal magnetization component Mz of the arterial blood AR flowing in the up-and-down direction SI can be made sufficiently smaller than the longitudinal magnetization component Mz of the venous blood VE.

After the execution of the longitudinal magnetization adjustment pulse sequence 21, the reverse pulse 22 is transmitted when a first waiting time Tw1 has elapsed as shown in FIG. 3(b). The reverse pulse 22 is of a non-selective reverse pulse. After a second waiting time Tw2 has elapsed after the transmission of the reverse pulse 22, the data acquisition pulse sequence 23 is executed.

A description will next be made of how the longitudinal magnetization components of the arterial blood AR and the venous blood VE change where the pulse sequence PS is executed.

FIGS. 5(a) and 5(b) show longitudinal magnetization recovery curves of the arterial blood AR and the venous blood VE where the pulse sequence PS is executed.

FIG. 5(a) shows an RF pulse −45x of the longitudinal magnetization adjustment pulse sequence 21, a reverse pulse 22 and a data acquisition pulse sequence 23.

FIG. 5(b) shows two longitudinal magnetization recovery curves C1 and C2 at the time that simulation is done as to how the longitudinal magnetization components of the venous blood VE and the arterial blood AR change during a period from the execution of the longitudinal magnetization adjustment pulse sequence 21 to the start of data acquisition.

The longitudinal magnetization recovery curve C1 corresponds to a longitudinal magnetization recovery curve (broken line) of the venous blood VE, and the longitudinal magnetization recovery curve C2 corresponds to a longitudinal magnetization recovery curve (solid line) of the arterial blood AR.

Simulation conditions (S1) through (S3) are as follows:

(S1) In the venous blood VE, its longitudinal magnetization component Mz becomes Mz=1 at a time t11 by execution of the longitudinal magnetization adjustment pulse sequence 21.

(S2) In the arterial blood AR, its longitudinal magnetization component Mz becomes zero at the time t11 by execution of the longitudinal magnetization adjustment pulse sequence 21.

(S3) The time required for the venous blood VE to reach from the longitudinal magnetization component Mz=1 to a null point is 1300 ms.

The longitudinal magnetization recovery curves C1 and C2 will be explained below.

(1) As to the longitudinal magnetization recovery curve C1

The longitudinal magnetization component Mz of the venous blood VE is Mz=1 at the time t11 (refer to the simulation condition (S1)). Thus, the longitudinal magnetization component Mz of the venous blood VE still remains at Mz=1 until the reverse pulse 22 is transmitted.

The reverse pulse 22 is transmitted at the point in time (time t12) when a first waiting time Tw1 has elapsed. Thus, the longitudinal magnetization component Mz of the venous blood VE is reversed from Mz=1 to Mz=−1.

The venous blood VE having the longitudinal magnetization component Mz=−1 reaches the null point at the point in time (time t13) when 1300 ms have elapsed (refer to the simulation condition (S3)).

(2) As to the longitudinal magnetization recovery curve C2

The longitudinal magnetization component Mz of the arterial blood AR is Mz=0 at the time t11 (refer to the simulation condition (S2)).

After the elapse of the time t11, the longitudinal magnetization component Mz of the arterial blood AR makes progress in longitudinal relaxation during the first waiting time Tw1, and the longitudinal magnetization component Mz of the arterial blood AR is recovered to Mz=M1. Since, however, the first waiting time Tw1 is very short (a few msec), the value of M1 is a value near zero.

Since the reverse pulse 22 is transmitted at the time t12, the longitudinal magnetization component Mz of the arterial blood AR is reversed from M1 to −M1. Since, however, the value of M1 is a value near zero, −M1 is also a value near zero.

The arterial blood AR makes progress in longitudinal relaxation again from the time t12. The longitudinal magnetization component Mz of the arterial blood AR is recovered to M2 during a period from the time t12 to the data acquisition start point of time t13. The value of M2 is a value of M2=0.5 or so.

While the longitudinal magnetization component Mz of the arterial blood AR is 0.5 or so at the data acquisition start time t13 as described above, the longitudinal magnetization component Mz of the venous blood VE is Mz=0. It is thus understood that an MR image in which the arterial blood AR is emphasized and the venous blood VE is suppressed is obtained by acquiring data at the data acquisition start time t13.

Incidentally, the above simulation condition (S2) shows that "the arterial blood AR becomes zero in its longitudinal magnetization component Mz by execution of the longitudinal magnetization adjustment pulse sequence 21". As described with reference to FIGS. 4(a) through 4(j), however, the longitudinal magnetization adjustment pulse sequence 21 can bring only the longitudinal magnetization component of the arterial blood AR flowing in the up-and-down direction SI to zero. It thus seems that the arterial blood AR flowing in a left-right direction RL and an anteroposterior direction AP within the field of view FOV cannot be visualized. However, after the longitudinal magnetization component has been brought to zero by execution of the longitudinal magnetization adjustment pulse sequence 21, the arterial blood AR flowing in the up-and-down direction SI reaches throughout the field of view FOV while flowing not only in the up-and-down direction SI but also in the left-right direction RL and the anteroposterior direction AP. Thus, since the arterial blood AR of the longitudinal magnetization component Mz=M2 (refer to FIGS. 5(a) and 5(b)) reaches throughout the field of view FOV until the start of data acquisition, the arterial blood AR can be visualized over within the entire field of view FOV.

A processing flow of the MRI apparatus at the time that the subject 11 is imaged or photographed will next be explained.

FIG. 6 is a diagram illustrating one example of the processing flow of the MRI apparatus 1.

At Step S11, the electrocardiac signal analysis device 101 (refer to FIG. 1) first receives an electrocardiac signal 7a and analyzes the same. When an R wave is generated at the electrocardiac signal 7a, the electrocardiac signal analysis device 101 sends an executive instruction for executing a longitudinal magnetization adjustment pulse sequence 21 (refer to FIG. 3(b)) to the coil control device 102 (refer to FIG. 1) in sync with the R wave. When the coil control device 102 receives this executive instruction, it controls the transmission coil 6 and the gradient coil 5 in such a manner that the longitudinal magnetization adjustment pulse sequence 21 is executed.

At Step S12, the coil control device 102 controls the transmission coil 6 and the gradient coil 5 in such a manner that a first waiting time Tw1 is provided after execution of the longitudinal magnetization adjustment pulse sequence 21. The first waiting time Tw1 is a time of a few msec or so.

At Step S13, the coil control device 102 controls the transmission coil 6 and the gradient coil 5 in such a manner that a reverse pulse 22 is transmitted when the first waiting time Tw1 has elapsed.

At Step S14, the coil control device 102 controls the transmission coil 6 and the gradient coil 5 in such a manner that a second waiting time Tw2 is provided after the transmission of the reverse pulse 22. The second waiting time Tw2 is a time of 1300 msec or so.

At Step S15, the coil control device 102 controls the transmission coil 6 and the gradient coil 5 in such a manner that a data acquisition pulse sequence 23 is executed.

In the first embodiment, a pulse sequence PS is executed in accordance with the flow of FIG. 6. Thus, the arterial blood AR flowing within the subject 11 can be visualized emphatically enough more than the venous blood VE flowing into the subject 11 at a low velocity.

Incidentally, since the pulse sequence shown in FIG. 3(b) is used as the longitudinal magnetization adjustment pulse sequence 21 in the first embodiment, other pulse sequences may be used. Several examples of other pulse sequences will be explained below.

Figure 7:
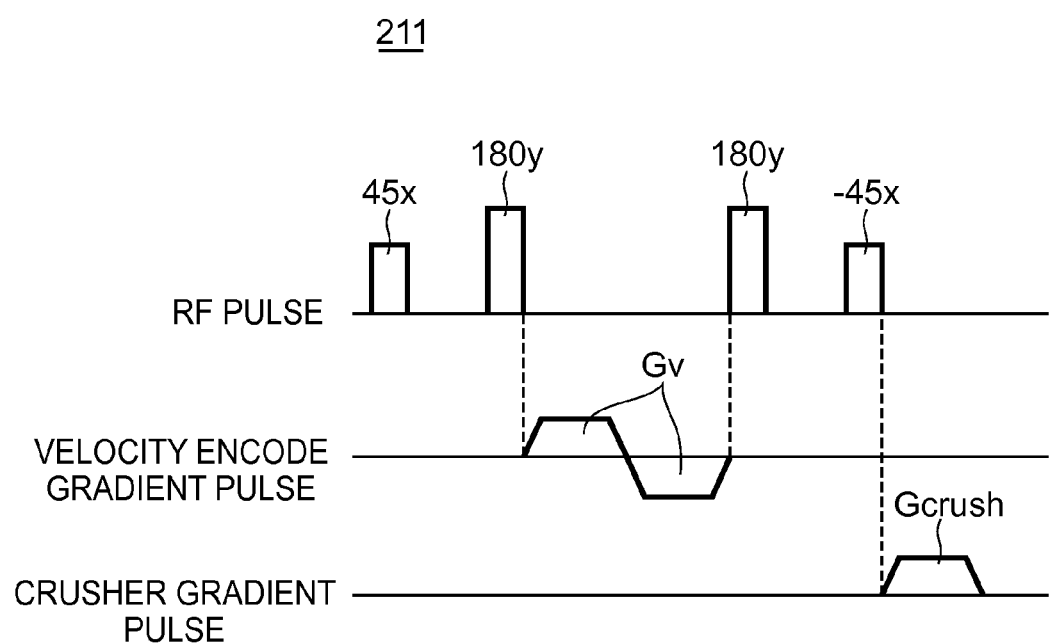
FIG. 7 is a modification of the longitudinal magnetization adjustment pulse sequence 21 of FIG. 3.

FIG. 7 is a modification of the longitudinal magnetization adjustment pulse sequence 21 shown in FIG. 3(b).

The longitudinal magnetization adjustment pulse sequence 211 shown in FIG. 7 has four types of RF pulses (45x, 180y, 180y and −45x), a velocity encode gradient pulse Gv and a crusher gradient pulse Gcrush.

In the longitudinal magnetization adjustment pulse sequence 211 shown in FIG. 7, the two RF pulses 180y are provided between the RF pulse 45x and the RF pulse −45x, and the velocity encode gradient pulse Gv is provided between the two RF pulses 180y. When an influence due to the nonuniformity of a static magnetic field (B0) is innegligible, such two RF pulses 180y are provided thereby to make it possible to bring the longitudinal magnetization component Mz of the arterial blood AR flowing in the up-and-down direction SI to Mz=0 and bring the longitudinal magnetization component Mz of the venous blood VE to Mz=1.

(2) Second Embodiment

In the first embodiment, the phases of the arterial blood and the venous blood are shifted using the velocity encode gradient pulse Gv (refer to FIGS. 4(c) and 4(h)). However, the phases of the arterial blood and the venous blood can also be shifted using the crusher gradient pulse as an alternative to the use of the velocity encode gradient pulse Gv. The second embodiment will explain a pulse sequence that shifts the phases of the arterial blood and the venous blood using the crusher gradient pulses.

Incidentally, a hardware configuration of an MRI apparatus according to the second embodiment is identical to the first embodiment.

FIG. 8 is a diagram illustrating one example of a pulse sequence that shifts the phases of the arterial blood and the venous blood using the crusher gradient pulses.

The pulse sequence PS shown in FIG. 8 has a longitudinal magnetization adjustment pulse sequence 212, a reverse pulse 22 and a data acquisition pulse sequence 23.

The longitudinal magnetization adjustment pulse sequence 212 has three RF pulses (90x, 180x, −90x) and crusher gradient pulses Gk1, Gk2 and Gk3. The crusher gradient pulses Gk1 and Gk2 are pulses identical to each other in polarity, application time tk, and the magnitude of a gradient field and are applied in the up-and-down direction SI (refer to FIG. 2). The behaviors of magnetization vectors of the arterial blood AR and the venous blood VE where the longitudinal magnetization adjustment pulse sequence 212 is used will next be described.

FIGS. 9(a) through 9(h) are diagrams illustrating the behaviors of the magnetization vectors of the arterial blood AR and the venous blood VE while the longitudinal magnetization adjustment pulse sequence 212 is being executed.

FIGS. 9(a), 9(b), 9(c), and 9(d) respectively indicate the orientations of magnetization vectors of the arterial blood AR at times t=t0, t1, t2 and t3 taken while the longitudinal magnetization adjustment pulse sequence 212 shown in FIG. 8 is being executed. Further, FIGS. 9(e), 9(f), 9(g), and 9(h) respectively indicate the orientations of magnetization vectors of the venous blood VE at the times t=t0, t1, t2 and t3 taken while the longitudinal magnetization adjustment pulse sequence 212 shown in FIG. 8 is being executed.

The meanings of the respective times t=t0, t1, t2 and t3 are as follows:

t0: applying start time of RF pulse 90x,
t1: applying end time of RF pulse 90x (applying start time of crusher gradient pulse Gk1),
t2: applying end time of crusher gradient pulse Gk2 (applying start time of RF pulse −190x), and
t3: applying end time of RF pulse −90x.

A description will next be made of the orientations of the magnetization vectors of the arterial blood AR and the venous blood VE at the respective times t=t0, t1, t2 and t3.

time t=t0                      (1)

Since the time t=t0 indicates the time at which the application of the RF pulse 90x is started, the magnetization vectors of the arterial blood AR and the venous blood VE are still oriented in a z-axis direction as indicated in FIGS. 9(a) and 9(e) at the time t=t0.

time t=t0 to t1                   (2)

The RF pulse 90x is applied.

time t=t1                       (3)

Since the application of the RF pulse 90x has been completed, the magnetization vectors of the arterial blood AR and the venous blood VE are tilted from the direction of 0° (z axis) to the direction of 90° (y axis) within a yz plane as indicated in FIGS. 9(b) and 9(f).

time t=t1 to t2                   (4)

The crusher gradient pulses Gk1 and Gk2 are applied. Further, the RF pulse 180y is transmitted between the crusher gradient pulses Gk1 and Gk2.

Since the venous blood VE is sufficiently slower in flow rate than the arterial blood AR, the moving distance of the venous blood VE between the times t1 and t2 can be ignored. Thus, the phase (refer to FIG. 9(g)) of the magnetization vector of the venous blood VE at the applying end time t2 of the crusher gradient pulse Gk2 is identical to the phase (refer to FIG. 9(f)) of the magnetization vector of the venous blood VE at the applying start time t1 of the crusher gradient pulse Gk1.

However, the arterial blood AR is moved at a blood flow velocity sufficiently faster than that of the venous blood VE. Thus, the phase of the magnetization vector of the arterial blood AR changes between the times t=t1 and t2. Since the crusher gradient pulses Gk1 and Gk2 are applied in the up-and-down direction SI (refer to FIG. 2) in the second embodiment, the phase of the magnetization vector of the arterial blood AR flowing in the up-and-down direction SI changes. In the second embodiment, the crusher gradient pulses Gk1 and Gk2 and the RF pulse 180y are defined or prescribed in such a manner that the phase of the magnetization vector of the arterial blood AR flowing in the up-and-down direction SI changes by 180° about the z axis as shown in FIG. 9(c).

It is thus understood that referring to FIGS. 9(c) and 9(g), the phase of the magnetization vector of the arterial blood AR flowing in the up-and-down direction SI is shifted 180° with respect to the phase of the magnetization vector of the venous blood VE at the time t2.

time t2 to t3   (5)

The RF pulse −90x is applied.

time t3   (6)

Since the application of the RF pulse −90x is completed, the magnetization vectors of the arterial blood AR and the venous blood VE are rotated −90° about the x axis. Thus, with the transmission of the RF pulse −90x, the magnetization vectors of the arterial blood AR and the venous blood VE can be rotated −90° within the yz plane as indicated in FIGS. 9(d) and 9(h). Thereafter, the crusher gradient pulse Gk3 (refer to FIG. 8) for bringing a transverse magnetization component My to zero is applied.

By executing the longitudinal magnetization adjustment pulse sequence 212 shown in FIG. 8 as described above, a longitudinal magnetization component Mz of the arterial blood AR flowing in the up-and-down direction SI becomes Mz=−1, and a longitudinal magnetization component Mz of the venous blood VE becomes Mz=1 (refer to FIGS. 9(d) and 9(h)). Accordingly, the longitudinal magnetization component Mz of the arterial blood AR flowing in the up-and-down direction SI can be made sufficiently smaller than the longitudinal magnetization component Mz of the venous blood VE.

After the execution of the longitudinal magnetization adjustment pulse sequence 212, a reverse pulse 22 is transmitted. The reverse pulse 22 is of a non-selective reverse pulse. After a second waiting time Tw2 has elapsed after the transmission of the reverse pulse 22, the data acquisition pulse sequence 23 is executed.

A description will next be made of how the longitudinal magnetization components of the arterial blood AR and the venous blood VE change where the pulse sequence PS shown in FIG. 8 is executed.

FIGS. 10(a) and 10(b) are diagrams illustrating longitudinal magnetization recovery curves of the arterial blood AR and the venous blood VE where the pulse sequence PS shown in FIG. 8 is executed.

FIG. 10(a) shows the pulse sequence PS shown in FIG. 8. Incidentally, the crusher gradient pulse Gk3 is omitted in the figure.

FIG. 10(b) shows two longitudinal magnetization recovery curves C1 and C2 at the time that simulation is done as to how the longitudinal magnetization components of the venous blood VE and the arterial blood AR change during a period from the execution of the longitudinal magnetization adjustment pulse sequence 212 to the start of data acquisition.

The longitudinal magnetization recovery curve C1 corresponds to a longitudinal magnetization recovery curve (broken line) of the venous blood VE, and the longitudinal magnetization recovery curve C2 corresponds to a longitudinal magnetization recovery curve (solid line) of the arterial blood AR.

Simulation conditions (S1) through (S3) are as follows:

(S1) In the venous blood VE, its longitudinal magnetization component Mz becomes Mz=1 at a time t11 by execution of the longitudinal magnetization adjustment pulse sequence 212.

(S2) In the arterial blood AR, its longitudinal magnetization component Mz becomes Mz=−1 at the time t11 by execution of the longitudinal magnetization adjustment pulse sequence 212.

(S3) The time required for the venous blood VE to reach from the longitudinal magnetization component Mz=−1 to a null point is 1300 ms.

The longitudinal magnetization recovery curves C1 and C2 will be explained below.

(1) As to the longitudinal magnetization recovery curve C1

The longitudinal magnetization component Mz of the venous blood VE is Mz=1 at the time t11 (refer to the simulation condition (S1)). Thus, the longitudinal magnetization component Mz of the venous blood VE still remains at Mz=1 until the reverse pulse 22 is transmitted.

The reverse pulse 22 is transmitted at the point in time (time t12) when a first waiting time Tw1 has elapsed. Thus, the longitudinal magnetization component Mz of the venous blood VE is reversed from Mz=1 to Mz=−1.

The venous blood VE having the longitudinal magnetization component Mz=−1 reaches the null point at the point in time (time t13) when 1300 ms have elapsed (refer to the simulation condition (S3)).

(2) As to the longitudinal magnetization recovery curve C2

The longitudinal magnetization component Mz of the arterial blood AR is Mz=−1 at the time t11 (refer to the simulation condition (S2)).

After the elapse of the time t11, the longitudinal magnetization component Mz of the arterial blood AR makes progress in longitudinal relaxation during the first waiting time Tw1, and the longitudinal magnetization component Mz of the arterial blood AR is recovered to Mz=−M1. Since, however, the first waiting time Tw1 is very short (a few msec), the value of −M1 is a value near zero.

Since the reverse pulse 22 is transmitted at the time t12, the longitudinal magnetization component Mz of the arterial blood AR is reversed from −M1 to M1.

The arterial blood AR makes progress in longitudinal relaxation again from the time t12. The longitudinal magnetization component Mz of the arterial blood AR is recovered to M2 during a period from the time t12 to a data acquisition start point of time t13. The value of M2 is a value approximately close to "1".

While the longitudinal magnetization component Mz of the arterial blood AR is a value near "1" at the data acquisition start time t13 as described above, the longitudinal magnetization component Mz of the venous blood VE is Mz=0. It is thus understood that an MR image in which the arterial blood AR is emphasized and the venous blood VE is suppressed is obtained by acquiring data at the data acquisition start time t13.

Incidentally, the above simulation condition (S2) shows that "the arterial blood AR becomes Mz=−1 in its longitudinal magnetization component Mz at the time t11 by execution of the longitudinal magnetization adjustment pulse sequence 212". As described with reference to FIG. 9, however, the longitudinal magnetization adjustment pulse sequence 21 can bring only the longitudinal magnetization component of the arterial blood AR flowing in the up-and-down direction SI to "−1". It thus seems that the arterial blood AR flowing in a left-right direction RL and an anteroposterior direction AP within a field of view FOV cannot be visualized. However, after the longitudinal magnetization component has been brought to "−1" by execution of the longitudinal magnetization adjustment pulse sequence 212, the arterial blood AR flowing in the up-and-down direction SI reaches throughout the field of view FOV while flowing not only in the up-and-down direction SI but also in the left-right direction RL and the anteroposterior direction AP. Thus, since the arterial blood AR of the longitudinal magnetization component Mz=M2 (refer to Fig. FIGS. 10(a) and 10(b)) reaches throughout the field of view FOV until the start of data acquisition, the arterial blood AR can be visualized over within the entire field of view FOV.

A modification of the longitudinal magnetization adjustment pulse sequence 212 shown in FIG. 8 will next be explained.

Figure 11:
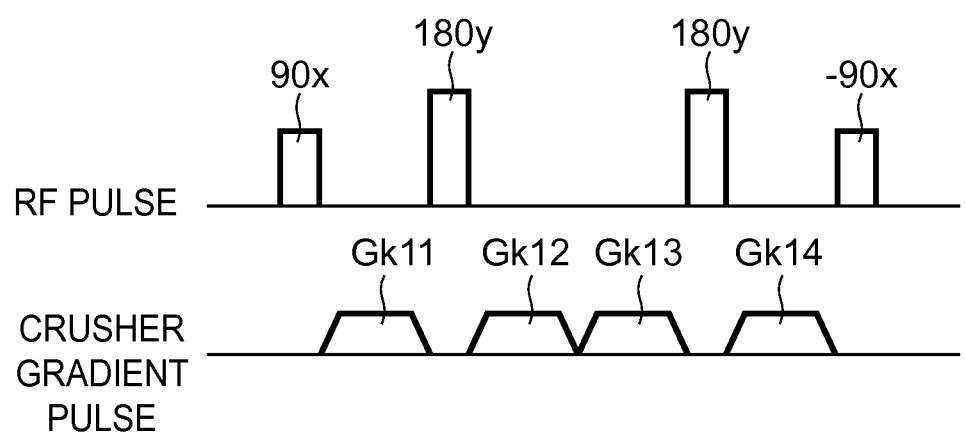
FIG. 11 is a diagram illustrating a modification of the longitudinal magnetization adjustment pulse sequence 212 of FIG. 8.

FIG. 11 is a diagram illustrating the modification of the longitudinal magnetization adjustment pulse sequence 212 shown in FIG. 8.

The longitudinal magnetization adjustment pulse sequence 213 shown in FIG. 11 has four types of RF pulses (90x, 180y, 180y and −90x) and crusher gradient pulses Gk11 through Gk14.

In the longitudinal magnetization adjustment pulse sequence 213 shown in FIG. 11, the two RF pulses 180y are provided between the RF pulse 90x and the RF pulse −90x. The crusher gradient pulse Gk11 is provided between the RF pulse 90x and the RF pulse 180y. The crusher gradient pulses Gk12 and Gk13 are provided between the two RF pluses 180y. The crusher gradient pulse Gk14 is provided between the RF pulse 180y and the RF pulse −90x. When an influence due to the nonuniformity of a static magnetic field (B0) is innegligible, such a pulse sequence 213 is used thereby to make it possible to bring the longitudinal magnetization component Mz of the arterial blood AR flowing in the up-and-down direction SI to Mz=−1 and bring the longitudinal magnetization component Mz of the venous blood VE to Mz=1.

(3) Third Embodiment

In the first and second embodiments, only the longitudinal magnetization component of the arterial blood flowing in the up-and-down direction SI is set smaller than the longitudinal magnetization component of the venous blood. However, a third embodiment will explain how to make a longitudinal magnetization component of arterial blood flowing in plural directions smaller than a longitudinal magnetization component of venous blood.

Incidentally, a hardware configuration of an MRI apparatus according to the third embodiment is identical to the first embodiment.

Figure 12:
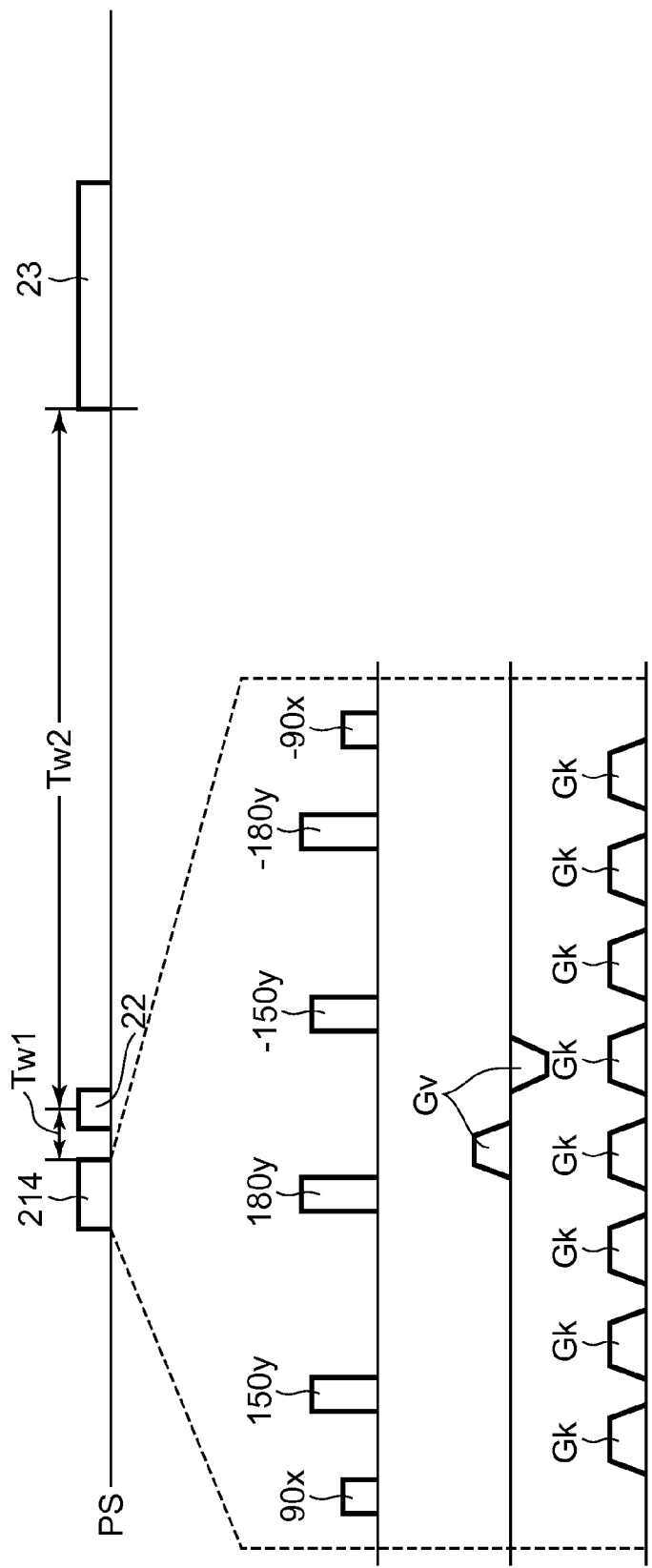
FIG. 12 is a diagram illustrating one example of a pulse sequence according to a third embodiment.

FIG. 12 is one example of a pulse sequence according to the third embodiment.

The pulse sequence PS shown in FIG. 12 has a longitudinal magnetization adjustment pulse sequence 214, a reverse pulse 22 and a data acquisition pulse sequence 23.

The longitudinal magnetization adjustment pulse sequence 214 has RF pulses (90x, 150y, 180y, −150y, −180y, −90y), a velocity encode gradient pulse Gv and a crusher gradient pulse Gk. The velocity encode gradient pulse Gv is applied in an up-and-down direction SI, and the crusher gradient pulse Gk is applied in a left-right direction RL. Since the phases of the arterial blood and the venous blood in both the up-and-down direction SI and the left-right direction RL can be shifted by using the longitudinal magnetization adjustment pulse sequence 214, the arterial blood can be visualized more emphatically.

(4) Fourth Embodiment

In the first through third embodiments, the reverse pulse 22 is transmitted after the longitudinal magnetization adjustment pulse sequence has been executed. However, the reverse pulse 22 can also be transmitted before the execution of the longitudinal magnetization adjustment pulse sequence. Therefore, a fourth embodiment will explain an example in which a reverse pulse 22 is transmitted before a longitudinal magnetization adjustment pulse sequence is executed.

Figure 13:
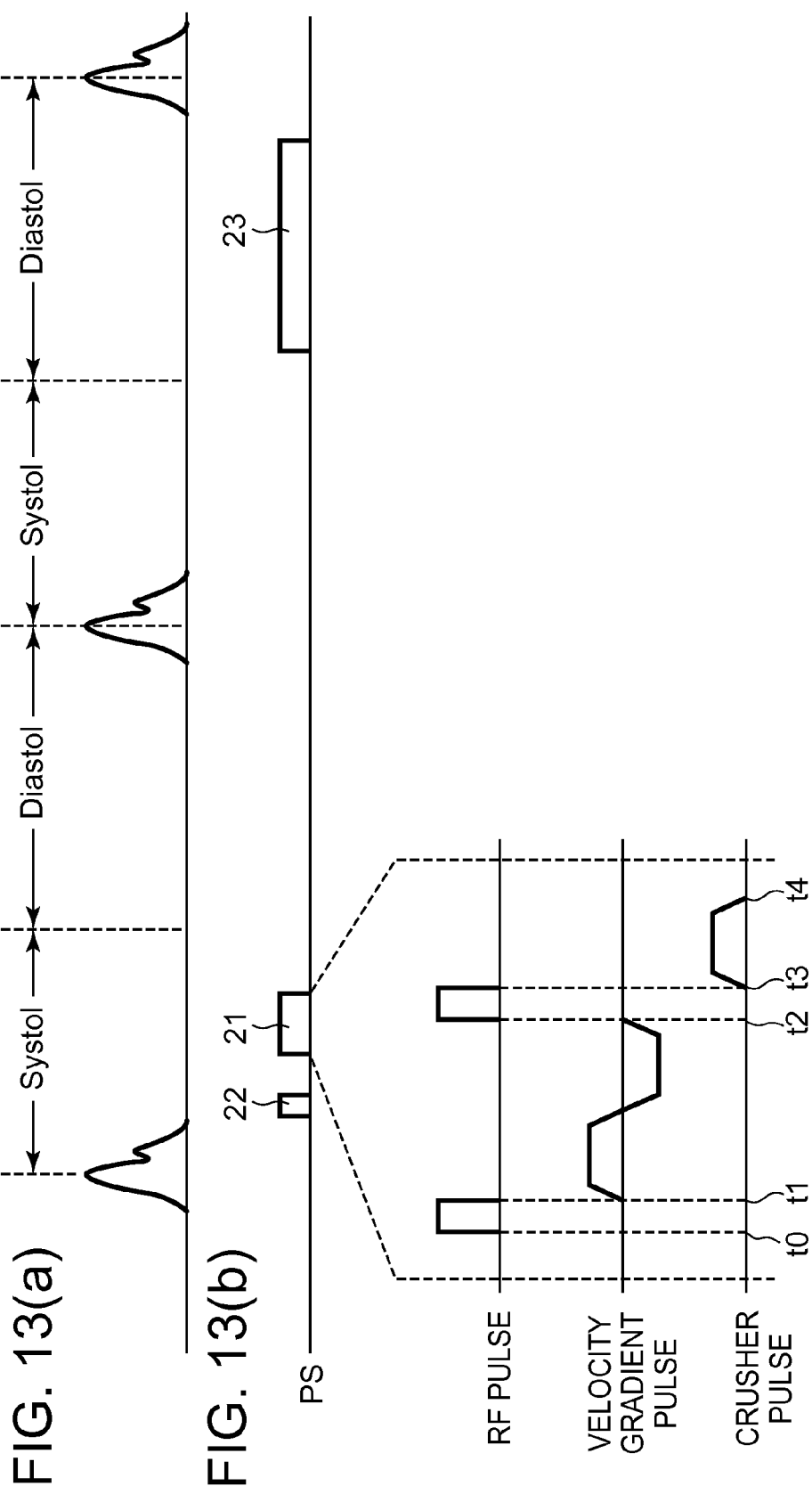
FIGS. 13(a) and 13(b) are diagrams for illustrating one example of a pulse sequence for imaging arterial blood AR according to a fourth embodiment and at which timing the pulse sequence is executed.

FIGS. 13(a) and 13(b) are diagrams for illustrating one example of a pulse sequence for imaging arterial blood AR in the fourth embodiment and at which timing the pulse sequence is executed.

FIG. 13(a) is a graph illustrating an electrocardiac signal waveform ECG of a subject 11, and FIG. 13(b) is a pulse sequence PS for imaging the arterial blood AR.

A reverse pulse 22, a longitudinal magnetization adjustment pulse sequence 21 and a data acquisition pulse sequence 23 are schematically shown in the pulse sequence PS of FIG. 13(b).

The longitudinal magnetization adjustment pulse sequence 21 of the fourth embodiment is identical to the longitudinal magnetization adjustment pulse sequence 21 shown in FIG. 3(b). A description will next be made of how longitudinal magnetization components of the arterial blood AR and venous blood VE change where the pulse sequence PS of FIG. 13(b) is executed.

Figure 14:
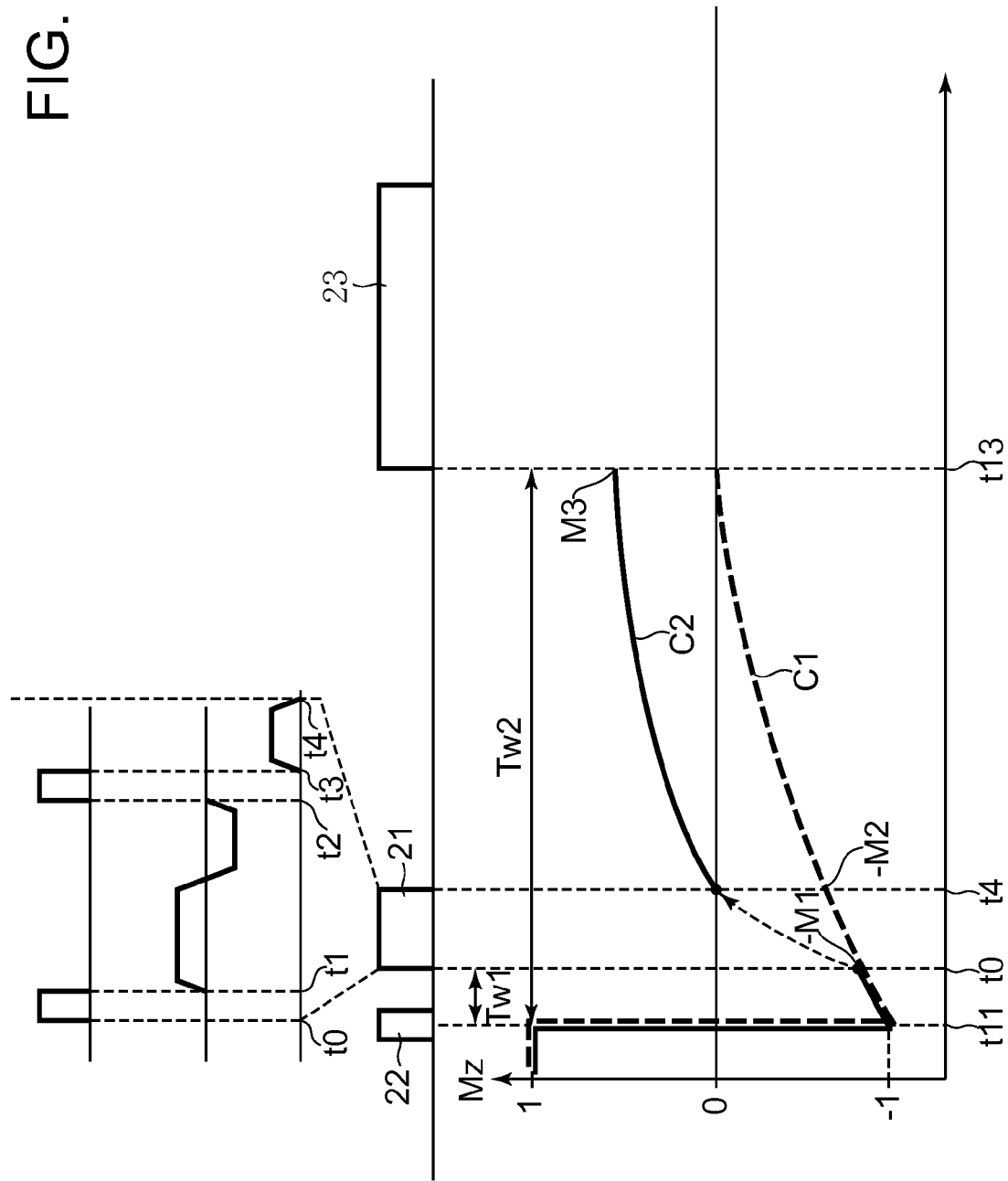
FIG. 14 shows longitudinal magnetization recovery curves of the arterial blood AR and venous blood VE where the pulse sequence PS of FIG. 13(b) is executed.

FIG. 14 shows longitudinal magnetization recovery curves of the arterial blood AR and venous blood VE where the pulse sequence PS of FIG. 13(b) is executed.

The longitudinal magnetization recovery curve C1 corresponds to a longitudinal magnetization recovery curve (broken line) of the venous blood VE, and the longitudinal magnetization recovery curve C2 corresponds to a longitudinal magnetization recovery curve (solid line) of the arterial blood AR.

The longitudinal magnetization recovery curves C1 and C2 will be explained below.

The reverse pulse 22 is transmitted at a time t11. Thus, the longitudinal magnetization components Mz of the arterial blood AR and venous blood VE are reversed from Mz=1 to Mz=−1.

After the elapse of the time t11, the longitudinal magnetization components Mz of the arterial blood AR and the venous blood VE are advanced in longitudinal relaxation during a first waiting time Tw1, and the longitudinal magnetization components Mz of the arterial blood AR and the venous blood VE are respectively recovered to Mz=−M1. Since, however, the first waiting time Tw1 is very short (a few msec), the value of −M1 is a value near −1.

At a time t0, the longitudinal magnetization adjustment pulse sequence 21 is executed.

FIGS. 15(a) through 15(j) are diagrams illustrating the behaviors of magnetization vectors of the arterial blood AR and venous blood VE of the subject 11 during a period from the start of execution of the longitudinal magnetization adjustment pulse sequence 21 to its end.

Since the description of FIGS. 15(a) through 15(j) can be made in a manner similar to FIGS. 4(a) through 4(j) according to the first embodiment, the detailed description of FIGS. 15(a) through 15(j) is omitted. Since the longitudinal magnetization components Mz of the arterial blood AR and the venous blood VE at a time t=t0 are a negative value (Mz=−M1) in FIG. 15, the longitudinal magnetization component Mz of the venous blood VE becomes a negative value (Mz=−M2) at a time t=t4 by execution of the longitudinal magnetization adjustment pulse sequence 21. On the other hand, the arterial blood AR is brought to Mz=0 at the time t=t4.

After the time t4, the arterial blood AR and the venous blood VE are advanced in longitudinal relaxation, and the longitudinal magnetization component Mz of the venous blood VE reaches a null point at a time t13. On the other hand, the longitudinal magnetization component Mz of the arterial blood AR is recovered to M3 during a period from the time t4 to a data acquisition start point of time t13. The value of M3 is a value of 0.5 or so.

As described above, the longitudinal magnetization component Mz of the arterial blood AR is Mz≈0.5 at the data acquisition start time t13. On the other hand, the longitudinal magnetization component Mz of the venous blood VE is Mz=0. It is thus understood that an MR image in which the arterial blood AR is emphasized and the venous blood VE is suppressed is obtained by acquiring data at the data acquisition start time t13.

In the first through fourth embodiments, the acquisition of data is started at the time t13 at which the longitudinal magnetization component of the venous blood VE has reached the null point. If it is however possible to emphasize the arterial blood AR and suppress the venous blood VE, then the data acquisition may be started before the longitudinal magnetization component of the venous blood VE reaches the null point. Alternatively, the data acquisition may be started after the longitudinal magnetization component of the venous blood VE has reached the null point.

Each of the first through fourth embodiments has described that the MR image in which the venous blood VE has been suppressed, is obtained. However, an MR image in which body fluids other than the venous blood VE are suppressed can be obtained by using the invention. For example, the acquisition of data is started when a longitudinal magnetization component of joint fluid or cerebral fluid has reached a null point, whereby an MR image can be obtained wherein arterial blood AR is emphasized and the joint fluid or cerebral fluid is suppressed.

Although only one reverse pulse 22 is used in the first through fourth embodiments, a plurality of reverse pulses 22 may be used. As the reverse pulse 22, for example, an Adiabatic pulse is preferably used. Using the Adiabatic pulse enables a reduction in the nonuniformity of a transmission magnetic field (B1).

Although the reverse pulse 22 is of the non-selective reverse pulse in the first through fourth embodiments, a selective reverse pulse may be used instead of the non-selective reverse pulse.

Although the data acquisition is started when the longitudinal magnetization component of the venous blood VE has reached the null point in the first through fourth embodiments, the longitudinal magnetization component of the venous blood VE can also be set so as to reach the null point after the data acquisition pulse sequence 23 has been started.

In the first through fourth embodiments, the data are acquired when the longitudinal magnetization component of the venous blood VE has reached the null point. When, however, it is desired to make the signal intensity of other fluid (joint fluid, cerebral fluid or the like) smaller than the signal intensity of the venous blood VE, data may be acquired when the longitudinal magnetization component of other fluid has reached the null point as an alternative to the venous blood VE.

Although the pulse sequence is executed based on the electrocardiac signal 7a in the first through fourth embodiments, the pulse sequence can also be executed without using the electrocardiac signal 7a. The pulse sequence may be executed in sync with the breathing of a subject with the provision of a breath analysis device for analyzing the breath or respiration of the subject.

When it is desired to suppress fats in the first through fourth embodiments, an STIR (Short TI Inversion Recovery) pulse is transmitted before the start of data acquisition, thereby making it possible to obtain an image in which the fats have also been suppressed.

Many widely different embodiments of the invention may be configured without departing from the spirit and the scope of the present invention. It should be understood that the present invention is not limited to the specific embodiments described in the specification, except as defined in the appended claims.

What is claimed is:

1. A magnetic resonance imaging apparatus configured to image a subject in such a manner that arterial blood of the subject is emphasized over venous blood flowing at a velocity slower than the arterial blood, the magnetic resonance imaging apparatus comprising:
   a transmission coil configured to transmit an RF pulse to the subject;
   a gradient coil configured to apply a gradient pulse to the subject; and
   a coil control device configured to control the transmission coil and the gradient coil such that:
   a longitudinal magnetization adjustment pulse sequence is executed on the arterial blood and the venous blood in order to set a longitudinal magnetization component positive in value of the arterial blood smaller than a longitudinal magnetization component positive in value of the venous blood, the longitudinal magnetization adjustment pulse sequence comprising:
   a first RF pulse configured to rotate the longitudinal magnetization components of the arterial blood and the venous blood by an angle of 45° degrees; and
   a second RF pulse configured to rotate the longitudinal magnetization components of the arterial blood and the venous blood by an angle of −45°;
   after the execution of the longitudinal magnetization adjustment pulse sequence, a longitudinal magnetization reverse pulse is transmitted to reverse the longitudinal magnetization components of the arterial blood and the venous blood; and
   after the transmission of the longitudinal magnetization reverse pulse, a data acquisition pulse sequence is executed in order to acquire data related to the arterial blood when an absolute value of the longitudinal magnetization component of the arterial blood flowing through an imaging area is larger than an absolute value of the longitudinal magnetization component of the venous blood.

2. A magnetic resonance imaging apparatus configured to image a subject such that arterial blood of the subject is emphasized over a venous blood flowing at a velocity slower than the arterial blood, the magnetic resonance imaging apparatus comprising:
   a transmission coil configured to transmit can RF pulse to the subject; a gradient coil configured to apply a gradient pulse to the subject; and
   a coil control device configured to control the transmission coil and the gradient coil such that:
   a longitudinal magnetization reversal pulse is transmitted to reverse longitudinal magnetization components positive in value of the arterial blood and the venous blood such that the arterial blood and the venous blood respectively have longitudinal magnetization components negative in value;
   after the transmission of the longitudinal magnetization reverse pulse, a longitudinal magnetization adjustment pulse sequence is executed in order to set the longitudinal magnetization component of the arterial blood larger than the longitudinal magnetization component of the venous blood, the longitudinal magnetization adjustment pulse sequence comprising:
- a first RF pulse configured to rotate the longitudinal magnetization components of the arterial blood and the venous blood by an angle of 45°; and
- a second RF pulse configured to rotate the longitudinal magnetization components of the arterial blood and the venous blood by an angle of −45°; and after the transmission of the longitudinal magnetization reverse pulse, a data acquisition pulse sequence is executed in order to acquire data related to the arterial blood when an absolute value of the longitudinal magnetization component of the arterial blood flowing through an imaging area is larger than an absolute value of the longitudinal magnetization component of the venous blood.

3. The magnetic resonance imaging apparatus according to claim 1, wherein the coil control device is configured to control the transmission coil and the gradient coil such that the phase of a magnetization vector of the arterial blood and the phase of a magnetization vector of the venous blood are shifted while the longitudinal magnetization adjustment pulse sequence is being executed.

4. The magnetic resonance imaging apparatus according to claim 3, wherein the coil control device is configured to control the gradient coil such that the gradient coil applies a velocity encode gradient pulse to shift the phase of the magnetization vector of the arterial blood and the phase of the magnetization vector of the venous blood from each other.

5. The magnetic resonance imaging apparatus according to claim 3, wherein the coil control device is configured to control the gradient coil and the transmission coil such that the gradient coil applies a first crusher gradient pulse and a second crusher gradient pulse to shift the phase of the magnetization vector of the arterial blood and the phase of the magnetization vector of the venous blood, and the transmission coil transmits a first RF pulse between the first crusher gradient pulse and the second crusher gradient pulse.

6. The magnetic resonance imaging apparatus according to claim 3, wherein the coil control device is configured to control the gradient coil and the transmission coil such that:
- the gradient coil applies a velocity encode gradient pulse to shift, from each other, the phase of the magnetization vector of the arterial blood and the phase of the magnetization vector of the venous blood flowing in a predetermined direction; and
- the gradient coil applies a first crusher gradient pulse and a second crusher gradient pulse in order to shift the phase of the magnetization vector of the arterial blood and the phase of the magnetization vector of the venous blood flowing in a direction different from the predetermined direction, from each other, and the transmission coil transmits a first RF pulse between the first crusher gradient pulse and the second crusher gradient pulse.

7. The magnetic resonance imaging apparatus according to claim 6, wherein the velocity encode gradient pulse is applied in the predetermined direction, and wherein the first crusher gradient pulse and the second crusher gradient pulse are applied in the direction different from the predetermined direction.

8. The magnetic resonance imaging apparatus according to claim 1, further comprising a heartbeat sensor configured to detect a heartbeat of the subject and to output an electrocardiac signal based on the detected heartbeat.

9. The magnetic resonance imaging apparatus according to claim 8, further comprising an electrocardiac signal analysis device configured to analyze the electrocardiac signal.

10. The magnetic resonance imaging apparatus according to claim 9, wherein the coil control device is configured to control the transmission coil and the gradient coil such that the longitudinal magnetization adjustment pulse sequence is executed during systole of the subject, based on the result of analysis by the electrocardiac signal analysis device.

11. The magnetic resonance imaging apparatus according to claim 9, wherein the coil control device is configured to control the transmission coil and the gradient coil such that the data acquisition pulse sequence is executed during diastole of the subject, based on the result of analysis by the electrocardiac signal analysis device.

12. The magnetic resonance imaging apparatus according to claim 1, further comprising a breath analysis device configured to analyze breathing of the subject.

13. The magnetic resonance imaging apparatus according to claim 1, wherein the longitudinal magnetization reverse pulse is of a non-selective RF reverse pulse.

14. The magnetic resonance imaging apparatus according to claim 13, wherein the longitudinal magnetization reverse pulse is of an Adiabatic pulse.

15. The magnetic resonance imaging apparatus according to claim 1, wherein a time interval between the longitudinal magnetization reverse pulse and the data acquisition pulse sequence is a time from the reversal of the longitudinal magnetization component of the venous blood by the longitudinal magnetization reverse pulse to the attainment thereof to a null point.

16. The magnetic resonance imaging apparatus according to claim 1, wherein the coil control device is configured to control the transmission coil such that the transmission coil transmits an additional longitudinal magnetization reverse pulse to reverse a longitudinal magnetization component of each static tissue.

17. The magnetic resonance imaging apparatus according to claim 16, wherein the static tissue is a fat.

18. A method for controlling a magnetic resonance imaging apparatus which images a subject in such a manner that arterial blood of the subject is emphasized over venous blood flowing at a velocity slower than the arterial blood, the method comprising:
- executing a longitudinal magnetization adjustment pulse sequence in order to set a longitudinal magnetization component positive in value for the arterial blood that is smaller than a longitudinal magnetization component positive in value of the venous blood with respect to the arterial blood and the venous blood, wherein the longitudinal magnetization adjustment pulse sequence includes:
- a first RF pulse configured to rotate the longitudinal magnetization components of the arterial blood and the venous blood by an angle of 45°; and
- a second RF pulse configured to rotate the longitudinal magnetization components of the arterial blood and the venous blood by an angle of −45°;
- after the execution of the longitudinal magnetization adjustment pulse sequence, transmitting a longitudinal magnetization reverse pulse in order to reverse the longitudinal magnetization components of the arterial blood and the venous blood; and
- after the transmission of the longitudinal magnetization reverse pulse, executing a data acquisition pulse sequence in order to acquire data related to the arterial blood when can absolute value of the longitudinal magnetization component of the arterial blood flowing through an imaging area is larger than an absolute value of the longitudinal magnetization component of the venous blood.

\* \* \* \* \*